US006737675B2

(12) United States Patent  
Patel et al.

(10) Patent No.: US 6,737,675 B2  
(45) Date of Patent: May 18, 2004

(54) HIGH DENSITY 3D RAIL STACK ARRAYS

(75) Inventors: Kedar Patel, Fremont, CA (US); Alper Ilkbahar, San Jose, CA (US); Roy Scheuerlein, Cupertino, CA (US); Andrew J. Walker, Mountain View, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/180,046

(22) Filed: Jun. 27, 2002

(65) Prior Publication Data

US 2004/0000679 A1 Jan. 1, 2004

(51) Int. Cl.[7] ............. H01L 29/76; H01L 31/036; H01L 31/112
(52) U.S. Cl. ............. 257/67; 257/206; 257/369; 257/393; 257/324
(58) Field of Search ............. 257/67, 206, 211, 257/369, 393, 903, 344, 347, 324

(56) References Cited

U.S. PATENT DOCUMENTS

| 3,414,892 A | 12/1968 | McCormack et al. |
| 3,432,827 A | 3/1969 | Sarno |
| 3,571,809 A | 3/1971 | Nelson |
| 3,573,757 A | 4/1971 | Adams |
| 3,576,549 A | 4/1971 | Hess |
| 3,582,908 A | 6/1971 | Koo |
| 3,629,863 A | 12/1971 | Neale |
| 3,634,929 A | 1/1972 | Yoshida et al. |
| 3,671,948 A | 6/1972 | Cassen et al. |
| 3,699,543 A | 10/1972 | Neale |
| 3,717,852 A | 2/1973 | Abbas et al. |
| 3,728,695 A | 4/1973 | Frohman-Bentchkowsky |
| 3,787,822 A | 1/1974 | Rioult |
| 3,846,767 A | 11/1974 | Cohen |

(List continued on next page.)

FOREIGN PATENT DOCUMENTS

| EP | 0 073 486 A2 | 8/1982 |
| EP | 0 387 834 A2 | 9/1990 |
| EP | 0 395 886 A2 | 11/1990 |
| EP | 0 516 866 A1 | 12/1992 |
| EP | 0 606 653 A1 | 7/1994 |
| EP | 0 644 548 A2 | 9/1994 |
| EP | 0 800 137 A1 | 3/1997 |
| JP | 61-222216 | 10/1986 |
| JP | 6-22352 | 1/1994 |
| JP | 63-52463 | 3/1998 |
| WO | WO 94/26083 | 11/1994 |
| WO | WO 02/15277 A2 | 2/2002 |

(List continued on next page.)

OTHER PUBLICATIONS

John H. Douglas: "The Route to 3–D Chips," High Technology, Sep. 1983, pp. 55–59, vol. 3, No. 9, High Technology Publishing Corporation, Boston, MA.

M. Arienzo et al.: "Diffusion of Arsenic in Bilayer Polycrystalline Silicon Films," J. Appl. Phys., Jan. 1984, pp. 365–369, vol. 55, No. 2, American Institute of Physics.

O. Bellezza et al.: "A New Self–Aligned Field Oxide Cell for Multimegabit Eproms," IEDM, pp. 579–582, IEEE.

(List continued on next page.)

*Primary Examiner*—Thien F Tran  
(74) *Attorney, Agent, or Firm*—Foley & Lardner

(57) ABSTRACT

A semiconductor device comprises two transistors where a gate electrode of one transistor and source or drain of another transistor are located in the same rail. A monolithic three dimensional array contains a plurality of such devices. The transistors in different levels of the array preferably have a different orientation.

51 Claims, 10 Drawing Sheets

U.S. PATENT DOCUMENTS

| | | |
|---|---|---|
| 3,863,231 A | 1/1975 | Taylor |
| 3,877,049 A | 4/1975 | Buckley |
| 3,886,577 A | 5/1975 | Buckley |
| 3,922,648 A | 11/1975 | Buckley |
| 3,980,505 A | 9/1976 | Buckley |
| 3,990,098 A | 11/1976 | Mastrangelo |
| 4,146,902 A | 3/1979 | Tanimoto et al. |
| 4,177,475 A | 12/1979 | Holmberg |
| 4,203,123 A | 5/1980 | Shanks |
| 4,203,158 A | 5/1980 | Frohman-Bentchkowsky et al. |
| 4,229,757 A | 10/1980 | Moussie |
| 4,272,880 A | 6/1981 | Pashley |
| 4,281,397 A | 7/1981 | Neal et al. |
| 4,419,741 A | 12/1983 | Stewart et al. |
| 4,420,766 A | 12/1983 | Kasten |
| 4,442,507 A | 4/1984 | Roesner |
| 4,489,478 A | 12/1984 | Sakurai |
| 4,494,135 A | 1/1985 | Moussie |
| 4,498,226 A | 2/1985 | Inoue et al. |
| 4,499,557 A | 2/1985 | Holmberg et al. |
| 4,507,757 A | 3/1985 | McElroy |
| 4,535,424 A | 8/1985 | Reid |
| 4,543,594 A | 9/1985 | Mohsen et al. |
| 4,569,121 A | 2/1986 | Lim et al. |
| 4,630,096 A | 12/1986 | Drye |
| 4,646,266 A | 2/1987 | Ovshinsky et al. |
| 4,672,577 A | 6/1987 | Hirose |
| 4,677,742 A | 7/1987 | Johnson |
| 4,710,798 A | 12/1987 | Marcantonio |
| 4,811,082 A | 3/1989 | Jacobs |
| 4,811,114 A | 3/1989 | Yamamoto et al. |
| 4,820,657 A | 4/1989 | Hughes et al. |
| 4,823,181 A | 4/1989 | Mohsen et al. |
| 4,855,953 A | 8/1989 | Tsukamoto et al. |
| 4,876,220 A | 10/1989 | Mohsen et al. |
| 4,881,114 A | 11/1989 | Mohsen et al. |
| 4,899,205 A | 2/1990 | Hamdy et al. |
| 4,922,319 A | 5/1990 | Fukushima |
| 4,943,538 A | 7/1990 | Mohsen et al. |
| 5,001,539 A | 3/1991 | Inoue et al. |
| 5,070,383 A | 12/1991 | Sinar et al. |
| 5,070,384 A | 12/1991 | McCollum et al. |
| 5,089,862 A | 2/1992 | Warner, Jr. et al. |
| 5,126,290 A | 6/1992 | Lowrey et al. |
| 5,160,987 A | 11/1992 | Pricer et al. |
| 5,191,405 A | 3/1993 | Tomita et al. |
| 5,202,754 A | 4/1993 | Bertin et al. |
| 5,233,206 A | 8/1993 | Lee et al. |
| 5,266,912 A | 11/1993 | Kledzik |
| 5,283,468 A | 2/1994 | Kondo et al. |
| 5,306,935 A | 4/1994 | Esquivel et al. |
| 5,311,039 A | 5/1994 | Kimura et al. |
| 5,334,880 A | 8/1994 | Abadeer et al. |
| 5,391,518 A | 2/1995 | Bhushan |
| 5,391,907 A | 2/1995 | Jang |
| 5,398,200 A | 3/1995 | Mazure et al. |
| 5,422,435 A | 6/1995 | Takiar et al. |
| 5,426,566 A | 6/1995 | Beilstein, Jr. et al. |
| 5,427,979 A | 6/1995 | Chang |
| 5,434,745 A | 7/1995 | Shokrgozar et al. |
| 5,441,907 A | 8/1995 | Sung et al. |
| 5,453,952 A | 9/1995 | Okudaira |
| 5,455,445 A | 10/1995 | Kurtz et al. |
| 5,463,244 A | 10/1995 | De Araujo et al. |
| 5,468,997 A | 11/1995 | Imai et al. |
| 5,471,090 A | 11/1995 | Deutsch |
| 5,481,133 A | 1/1996 | Hsu |
| 5,495,398 A | 2/1996 | Takiar et al. |
| 5,502,289 A | 3/1996 | Takiar et al. |
| 5,517,038 A | 5/1996 | Maeda et al. |
| 5,523,622 A | 6/1996 | Harada et al. |
| 5,523,628 A | 6/1996 | Williams et al. |
| 5,535,156 A | 7/1996 | Levy et al. |
| 5,536,968 A | 7/1996 | Crafts et al. |
| 5,552,963 A | 9/1996 | Burns |
| 5,561,622 A | 10/1996 | Bertin et al. |
| 5,581,498 A | 12/1996 | Ludwig et al. |
| 5,585,675 A | 12/1996 | Knopf |
| 5,640,343 A | 6/1997 | Gallagher et al. |
| 5,654,220 A | 8/1997 | Leedy |
| 5,675,547 A | 10/1997 | Koga |
| 5,693,552 A | 12/1997 | Hsu |
| 5,696,031 A | 12/1997 | Wark |
| 5,703,747 A | 12/1997 | Voldman et al. |
| 5,737,259 A | 4/1998 | Chang |
| 5,745,407 A | 4/1998 | Levy et al. |
| 5,751,012 A | 5/1998 | Wolstenholme et al. |
| 5,770,483 A * | 6/1998 | Kadosh et al. .............. 438/152 |
| 5,776,810 A | 7/1998 | Guterman et al. |
| 5,780,925 A | 7/1998 | Cipolla et al. |
| 5,781,031 A | 7/1998 | Bertin et al. |
| 5,793,697 A | 8/1998 | Scheuerlein |
| 5,801,437 A | 9/1998 | Burns |
| 5,831,325 A | 11/1998 | Zhang |
| 5,835,396 A | 11/1998 | Zhang |
| 5,838,530 A | 11/1998 | Zhang |
| 5,883,409 A | 3/1999 | Guterman et al. |
| 5,915,167 A | 6/1999 | Leedy |
| 5,969,380 A | 10/1999 | Seyyedy |
| 5,976,953 A | 11/1999 | Zavracky et al. |
| 5,978,258 A | 11/1999 | Manning |
| 5,985,693 A | 11/1999 | Leedy |
| 5,991,193 A | 11/1999 | Gallagher et al. |
| 6,034,882 A | 3/2000 | Johnson et al. |
| 6,055,180 A | 4/2000 | Gudesen et al. |
| 6,057,598 A | 5/2000 | Payne et al. |
| 6,072,234 A | 6/2000 | Camien et al. |
| 6,087,722 A | 7/2000 | Lee et al. |
| 6,110,278 A | 8/2000 | Saxena |
| 6,130,835 A | 10/2000 | Scheuerlein |
| 6,133,640 A | 10/2000 | Leedy |
| 6,185,122 B1 | 2/2001 | Johnson et al. |
| 6,197,641 B1 | 3/2001 | Hergenrother et al. |
| 6,208,545 B1 | 3/2001 | Leedy |
| RE37,259 E | 7/2001 | Ovshinsky |
| 6,281,042 B1 | 8/2001 | Ahn et al. |
| 6,291,858 B1 | 9/2001 | Ma et al. |
| 6,307,257 B1 | 10/2001 | Huan et al. |
| 6,314,013 B1 | 11/2001 | Ahn et al. |
| 6,322,903 B1 | 11/2001 | Siniaguine et al. |
| 6,337,521 B1 | 1/2002 | Masuda |
| 6,351,028 B1 | 2/2002 | Akram |
| 6,353,265 B1 | 3/2002 | Michii |
| 6,355,501 B1 | 3/2002 | Fung et al. |
| 6,593,624 B2 * | 7/2003 | Walker ...................... 257/344 |
| 6,612,570 B1 | 9/2003 | Cox |
| 2001/0055838 A1 | 12/2001 | Lee et al. |
| 2002/0028541 A1 | 3/2002 | Lee et al. |

OTHER PUBLICATIONS

S.D. Brotherton et al.: "Excimer–Laser–Annealed Poly–Si Thin–Film Transistors," IEEE Transitions on Electron Devices, Feb. 1993, pp. 407–413, vol. 40, No. 2, IEEE.

P. Candelier et al.: "Simplified 0.35–$\mu$m Flash EEPROM Process Using High–Temperature Oxide (HTO) Deposited by LPCVD as Interpoly Dielectrics and Peripheral Transistors Gate Oxide," IEEE Electron Device Letters, Jul. 1997, pp. 306–308, vol. 18, No. 7, IEEE.

Min Cao et al.: "A High–Performance Polysilicon Thin–Film Transistor Using XeCl Excimer Laser Crystallization of Pre–Patterned Amorphous Si Films," IEEE Transactions on Electron Devices, Apr. 1996, pp. 561–567, vol. 43, No. 4, IEEE.

Mino Cao et al.: "A Simple EEPROM Cell Using Twin Polysilicon Thin Film Transistors," IEEE Electron Device Letters, Aug. 1994, pp. 304–306, vol. 15, No. 8, IEEE.

Bomy Chen et al.: "Yield Improvement for a 3.5–ns BIC-MOS Technology in a 200–mm Manufacturing Line," IBM Technology Products, 1993, pp. 301–305, VLSITSA.

Victor W.C. Chan et al.: "Three Dimensional CMOS Integrated Circuits on Large Grain Polysilicon Films," IEDM, 2000, IEEE.

Boaz Eitan et al.: "Alternate Metal Virtual Ground (AMG)—A New Scaling Concept for Very High–Density EPROM's," IEEE Electron Device Letters, pp. 450–452, vol. 12, No. 8, Aug. 1991, IEEE.

Boaz Eitan et al.: "Multilevel Flash cells and their Trade–offs," IEEE Electron Device Letters , pp. 169–172, 1996, IEEE.

Dr. Heinrich Endert: "Excimer Lasers as Tools for Material Processing in Manufacturing," Technical Digest: International Electron Devices Meeting, 1985, pp. 28–29, Washington, DC, Dec. 1–4, 1985, Göttingen, Germany.

Dov Frohman–Bentchkowsky: "A Fully Decoded 2048–Bit Electrically Programmable FAMOS Read–Only Memory," IEEE Journal of Solid–State Circuits, pp. 301–306, vol. sc–6, No. 5, Oct. 1971.

G.K. Giust et al.: "Laser–Processed Thin–Film Transistors Fabricated from Sputtered Amorphous–Silicon Films," IEEE Transactions on Electron Devices, pp. 207–213, vol. 47, No. 1, Jan. 2000, IEEE.

G.K. Giust et al.: "High–Performance Thin–Film Transistors Fabricated Using Excimer Laser Processing and Grain Engineering," IEEE Transactions on Electron Devices, pp. 925–932, vol. 45, No. 4, Apr. 1998, IEEE.

G.K. Giust et al.: "High–Performance Laser–Processed Polysilicon Thin–Film Transistors," IEE Electron Device Letters, pp. 77–79, vol. 20, No. 2, Feb. 1999, IEEE.

Fumihiko Hayashi et al.: "A Self–Aligned Split–Gate Flash EEPROM Cell with 3–D Pillar Structure," 1999 Symposium on VLSI Technology Digest of Technical Papers, pp. 87–88, Stanford University, Stanford, CA 94305, USA.

Stephen C.H. Ho et al.: "Thermal Stability of Nickel Silicides in Different Silicon Substrates," Department of Electrical and Electronic Engineering, pp. 105–108, 1998, IEEE.

J. Esquivel et al. "High Density Contactless, Self Aligned EPROM Cell Array Technology," Texas Instruments (Dallas), IEDM 86, pp. 592–595, 1986, IEEE.

R. Kazerounian et al.: Alternate Metal Virtual Ground EPROM Array Implemented in a 0.8μm Process for Very High Density Applications, IEDM 91, pp. 311–314, 1991, IEEE.

Chang–Dong Kim et al.: "Short–Channel Amorphous–Silicon Thin–Film Transistors," IEEE Transactions on Electron Devices, pp. 2172–2176, vol. 43, No. 12, Dec. 1996, IEEE.

Johan H. Klootwijk et al.: "Deposited Inter–Polysilicon Dielectrics for Nonvolatle Memories," IEEE Transactions on Electron Devices , pp. 1435–1445, vol. 46, No. 7, Jul. 1999, IEEE.

Web Page: Ja–Hum Ku et al.: "High Performance pMOS-FETs With Ni(Si/sub x /Ge/sub 1–x Si/Sub 0.8/Ge/sub 0.2/ gate, IEEE Xplore Citation Web Page," VLSI Technology, 2000.

Nae–In Lee et al.: "High–Performance EEPROM's Using N– and P–Channel Polysilicon Thin–Film Transistors with Electron Cyclotron Resonance N2O–Plasma Oxide," pp. 15–17, IEEE Electron Device Letters, vol. 20, No. 1, Jan. 1999, IEEE.

Jin–Woo Lee et al.: "Improved Stability of Polysilicon Thin–Film Transistors under Self–Heating and High Endurance EEPROM Cells for Systems–On–Panel," IEEE Electron Device Letters, 1998, pp. 265–268, IEEE.

Seok–Woon Lee et al.: "Pd induced lateral crystallization of Amorphous Si Thin Films," Appl. Phys. Lett. 66 (13), pp. 1671–1673, Mar. 27, 1995, American Institute of Physics.

K. Miyashita etal.: "Optimized Halo Structure for 80 nm Physical Gate CMOS Technology with Indium and Antimony Highly Angled Ion Implantation," IEDM 99–645, pp. 27.2.1–27.2.4, 1999, IEEE.

N.D. Young et al.: "The Fabrication and Characterization of EEPROM Arrays on Glass Using a Low–Temperature Poly–Si TFT Process," IEEE Transactions on Electron Devices, pp. 1930–1936, vol. 43, No. 11, Nov. 1996, IEEE.

Jung–Hoon Oh et al.: "A High–Endurance Low–Temperature Polysilicon Thin–Film Transistor EEPROM Cell," pp. 304–306, IEEE Electron Device Letters, vol. 21, No. 6, Jun. 2000, IEEE.

Web Page: M.C. Poon. et al.: "Thermal Stability of Cobalt and Nickel Silicides in Amorpho Crystalline Silicon," IEEE Xplore Web Page, 1997.

Noriaki Sato et al.: A New Programmable Cell Utilizing Insulator Breakdown, IEDM 85, pp. 639–642, 1985, IEEE.

Takeo Shiba et al.: "In Situ Phosphorus–Doped Polysilicon Emitter Technology for Very High–Speed, Small Emitter Bipolar Transistors," IEEE Transactions on Electron Devices , pp. 889–897, vol. 43, No. 6, Jun. 1996, IEEE.

Seungheon Song et al.: "High Performance Transistors with State–of–the–Art CMOS Technologies," IEDM 99, pp. 427–430, 1999, IEEE.

Yoshihiro Takao et al. "Low–Power and High–Stability SRAM Technology Using a Laser–Recrystallized p–Channel SOI MOSFET," IEEE Transactions on Electron Devices, pp. 2147–2152, vol. 39, No. 9, Sep. 1992, IEEE.

Kenji Taniguchi et al.: "Process Modeling and Simulation: Boundary Conditions for Point Defect–Based Impurity Diffusion Model," IEEE Transactions on Computer–Aided Design , pp. 1177–1183, vol. 9, No. 11, Nov. 1990, IEEE.

Hongmei Wang et al.: "Submicron Super TFTs for 3–D VLSI Applications," IEEE Electron Device Letters, vol. 21, No. 9, pp. 439–441, Sep. 2000, IEEE.

Hongmei Wang et al.: "Super Thin–Film Transistor with SOI CMOS Performance Formed by a Novel Grain Enhancement Method," IEEE Transactions on Electron Devices, pp. 1580–1586, vol. 47, No. 8, Aug. 2000, IEEE.

Marvin H. White et al. On the Go With Sonos, Circuit & Devices, pp. 22–31, Jul. 2000, IEEE.

B.J. Woo et al.: "A Novel Memory Cell Using Flash Array Contactless Eprom (Face) Technology," IEDM, pp. 90–93, 1990, IEEE.

Web Page: Qi Xiang et al.: "Deep sub–100 nm CMOS with Ultra Low Gate Sheet Resista NiSi," IEEE Xplore Web Page, 2000.

Qi Xiang et al. Deep Sub–100nm CMOS with Ultra Low Gate Sheet Resistance by NiSi, IEEE, pp. 76–77, 2000, Symposium on VLSI Technology Digest of Technical Papers.

Qiuxia Xu et al.: "New Ti–SALICIDE Process Using Sb and Ge Preamorphization for Sub–0.2 μm CMOS Technology," IEEE Transactions on Electron Devices, pp. 2002–2009, vol. 45, No. 9, Sep. 1998, IEEE.

Kuniyoshi Yoshikawa et al.: "An Asymmetrical Lightly Doped Source Cell for Virtual Ground High–Density EPROM's," IEEE Transactions on Electron Devices, pp. 1046–1051, vol. 37, No. 4, Apr. 1990, IEEE.

Vivek Subramanian: "Control of Nucleation and Grain Growth in Solid–Phase Crystallized Silicon for High–Performance Thin Film Transistors," A Dissertation submitted to the Department of Electrical Engineering and the Committee of Graduate Studies of Stanford University, 1998.

Dietmar Gogl et al.: "A 1–Kbit EEPROM in SIMOX Technology for High–Temperature Applications up to 250° C," IEEE Journal of Solid–State Circuits, Oct. 2000, vol. 35, No. 10, IEEE.

Brian Dipert: "Exotic Memories, Diverse Approaches: Newfangled Memory Technologies Come and Go, But Every Once in a While, One Makes It Out of the Laboratory and Into Your Next Design. All of These Candidates Aspire to be the Next Semiconductor Success Story. Which Ones' Dreams Will Come True?" EDN ASIA web page (Sep. 2001).

Abou–Samra S.J.: "3D CMOS SOI for High Performance Computing", Low Power Electronics and Design Proceedings, 1998.

Yamazaki K.: "4–Layer 3–D IC Technologies for Parallel Signal Processing", International Electron Devices Meeting Technical Digest, Dec. 9–12, 1990, pp. 25.5.1–25.5.4.

Akasaka Yoichi: Three–dimensional Integrated Circuit: Technology and Application Prospect, Microelectronics Journal, vol. 20, No.s 1–2, 1989, pp. 105–112.

Sakamoto Kaji: "Architecture des Circuits a Trois Dimension (Architecture of Three Dimensional Devices)", Bulletin of the Electrotechnical Laboratory, ISSN 0366–9092, vol. 51, No. 1, 1987, pp. 16–29.

Akasaka Yoichi: "Three–dimensional IC Trends", Proceedings of the IEEE, vol. 74, No. 12, 1986, pp. 1703–1714.

Carter William H.: "National Science Foundation (NSF) Forum on Optical Science and Engineering", Proceedings SPIE—The International Society for Optical Engineering, vol. 2524, Jul. 11–12 1995, (Article by N. Joverst titled "Manufacturable Multi–Material Integration Compound Semi–conductor Devices Bonded to Silicon Circuity".

Hayashi Y.: "A New Three Dimensional IC Fabrication Technology, Stacking Thin Film Dual–CMOS Layers", IEDM, 1991, pp. 25.6.1–25.6.4.

Reber M.: "Benefits of Vertically Stacked Integrated Circuits for Sequential Logic", IEEE, 1996, pp. 121–124.

Stern Jon M.: Design and Evaluation of an Epoxy Three–dimensional Multichip Module, IEEE Transactions on Components, Packaging, and Manufacturing Technology—Part B, vol. 19, No. 1, Feb. 1996, pp. 188–194.

Bertin Claude L.: "Evaluation of a Three–dimensional Memory Cube System", IEEE Transactions on Components, Hybrids, and Manufacturing Technology, vol. 16, No. 8, Dec. 1993, pp. 1006–1011.

Watanabe Hidehiro: "Stacked Capacitor Cells for High–density Dynamic RAMs", IEDM, 1988, pp. 600–603.

Web Page: "Stacked Memory Modules", IBM Technical Disclosure Bulletin, vol. 38, No. 5, 1995.

Thakur Shashidhar: "An Optimal Layer Assignment Algorithm for Minimizing Crosstalk for Three VHV Channel Routing", IEDM, 1995, pp. 207–210.

Terril Rob: "3D Packaging Technology Overview and Mass Memory Applications", IEDM, 1996, pp. 347–355.

Inoue Y.: "A Three–Dimensional Static RAM", IEEE Electron Device Letters, vol. 7, No. 5, May 1986, pp. 327–329.

Reber M.: "Benefits of Vertically Stacked Integrated Circuits for Sequential Logic", IEDM, 1996, pp. 121–124.

Kurokawa Takakazu: "3–D VLSI Technology in Japan and an Example: A Syndrome Decoder for Double Error Correction", FGCS—Future, Generation, Computer, Systems, vol. 4, No. 2, 1988, pp. 145–155, Amsterdam, The Netherlands.

Makiniak David: "Vertical Integration of Silicon Allows Packaging of Extremely Dense System Memory In Tiny Volumes: Memory–chip Stacks Send Density Skyward", Electronic Design, No. 17, Aug. 22, 1994, pp. 69–75, Cleveland Ohio.

Schlaeppi H.P.: "nd Core Memories using Multiple Coincidence", IRE Transactions on Electronic Computers, Jun. 1960, pp. 192–196.

Schlaeppppi H.P.: "Session V: Information Storage Techniques", International Solid–State Circuits Conference, Feb. 11, 1960, pp. 54–55.

Yamazaki K.: "Fabrication Technologies for Dual 4–KBIT Stacked SRAM", IEDM 16.8., 1986, pp. 435–438.

De Graaf C. et al.: "A Novel High–Density, Low–Cost Diode Programmable Read Only Memory," IEDM, beginning at p. 189.

Abstract "Layers of BST Materials Push Toward 1Gbit DRAM", Electronics Times, Oct. 19, 1995.

Abstract, "Technologies Will Pursue Higher DRAM Densities", Electronic News (1991), Dec. 4, 1994, p. 12.

Abstract "Looking Diverse Storage", Electronic Engineering Times, Oct. 31, 1994, p. 44.

Abstract "Special Report: Memory Market Startups Cubic Memory: 3D Space Savers", Semiconductor Industry & Business Survey, vol. 16, No. 13, Sep. 12, 1994.

Abstract "Technique Boosts 3D Memory Density", Electronic Engineering Times, Aug. 29, 1994, p. 16.

Abstract "Memory Packs Poised 3D Use", Electronic Engineering Times, Dec. 7, 1992, p. 82.

Abstract "MCMs Hit the Road", Electronic Engineering Times, Jun. 15, 1992, p. 45.

Abstract "IEDM Ponders the 'Gigachip' Era", Electronic Engineering Times, Jan. 20, 1992, p. 33.

Abstract "Tech Watch: 1–Gbit DRAM in Sight", Electronic World News, Dec. 16, 1991, p. 20.

Abstract "MCMs Meld into Systems", Electronic Engineering Times, Jul. 22, 1991, p. 35.

Abstract "Systems EEs See Future in 3D", Electronic Engineering Times, Sep. 24, 1990, p. 37.

Patent Application, NISHIURA, US 2001/00054759 A1.

Patent Application, FURUSAWA, US 2002/0024146 A1.

Patent Application, FUJIMOTO et al, US 2002/0027275 A1.

Patent Application, AKRAM, US 2002/0030262 A1.

Patent Application, AKRAM, US 2002/0030263 A1.

Patent Application, Leedy, US 2001/0033030 A1.

"3D Chip–On–Chip Stacking," Semiconductor International, Dec. 1991.

Richard W. Lay: "TRW Develops Wireless Multiboard Interconnect System," Electronic Engineering Times, Nov. 5, 1994.

Patent Application, Walker, US 2003–0057435 A1.

Patent Application, Walker, et al, US 2003–0030074 A1.

Patent Application, Kouznetsov, et al, US 2002–0142546 A1.

Peter K. Naji et al.: "A 256kb 3.0V 1T1MTJ Nonvolatile Magnetoresistive RAM," 2001 IEEE International Solid–State Circuits Conference, Digest of Technical Papers, ISSCC 2001/Session 7/Technology Directions: Advanced Technologies/7.6, Feb. 6, 2001, pp. 122–123 (including enlargement of figures, totaling 9 pages), and associated Visual Supplement, pp. 94–95,4040–405 (enlargements of slides submitted, totaling 25 pages).

Kim C. Hardee et al.: "A Fault–Tolerant 30 ns/375 mW 16K×1 NMOS Static RAM," IEEE Journal of Solid–State Circuits, Oct. 1981, vol. SC–16, No. 5, pp. 435–443.

Toshio Wada et al.: "A 15–ns 1024–Bit Fully Static MOS RAM," IEEE Journal of Solid–State Circuits, Oct. 1978, vol. SC–13, No. 5, pp. 635–639.

Camperi–Ginestet C.: "Vertical Electrical Interconnection of Compound Semiconductor Thin–Film Devices to Underlying Silicon Circuitry", IEEE Photonics Technology Letters, vol. 4, No. 9, Sep. 1992, pp. 1003–1006.

Pein Howard: "Performance of the 3–D Pencil Flash EPROM Cell an Memory Array", IEEE Transactions on Electron Devices, vol. 42, No. 11, Nov. 1995, pp. 1982–1991.

Abstract Lomatch S.: "Multilayered Josephson Junction Logic and Memory Devices", Proceedings of the SPIE–The International Society for Optical Engineering vol. 2157, pp. 332–343.

Abstract Lu N.C.C.: "Advanced Cell Structures for Dynamic RAMs", IEEE Circuits and Devices Magazine, vol. 5, No. 1, Jan. 1989, pp. 27–36.

Abstract Sakamato K.: "Architecture of Three Dimensional Devices", Journal: Bulletin of the Electrotechnical Laboratory, vol. 51, No. 1, 1987, pp. 16–29.

Abstract "Wide Application of Low–Cost Associative Processing Associative Processing Seen", Electronic Engineering Times, Aug. 26, 1996, p. 43.

Abstract "Interconnects & Packaging", Electronic Engineering Times, Nov. 27, 1995, p. 43.

Abstract "Closing in on Gigabit DRAMs", Electronic Engineering Times, Nov. 27, 1995, p. 35.

Abstract "Module Pact Pairs Cubic Memory with Vision-Tek", Semiconductor Industry & Business Survey, vol. 17, No. 15, Oct. 23, 1995.

* cited by examiner

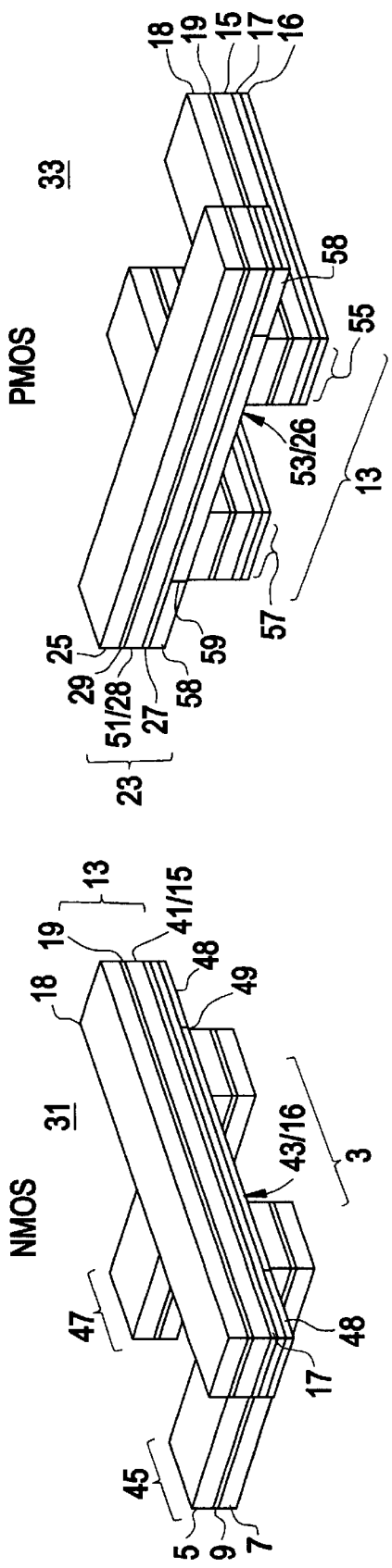
FIG. 2
FIG. 3

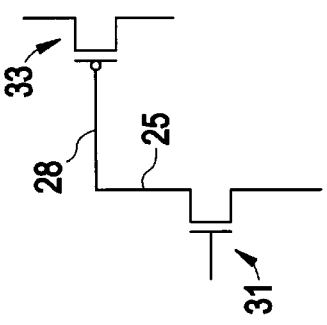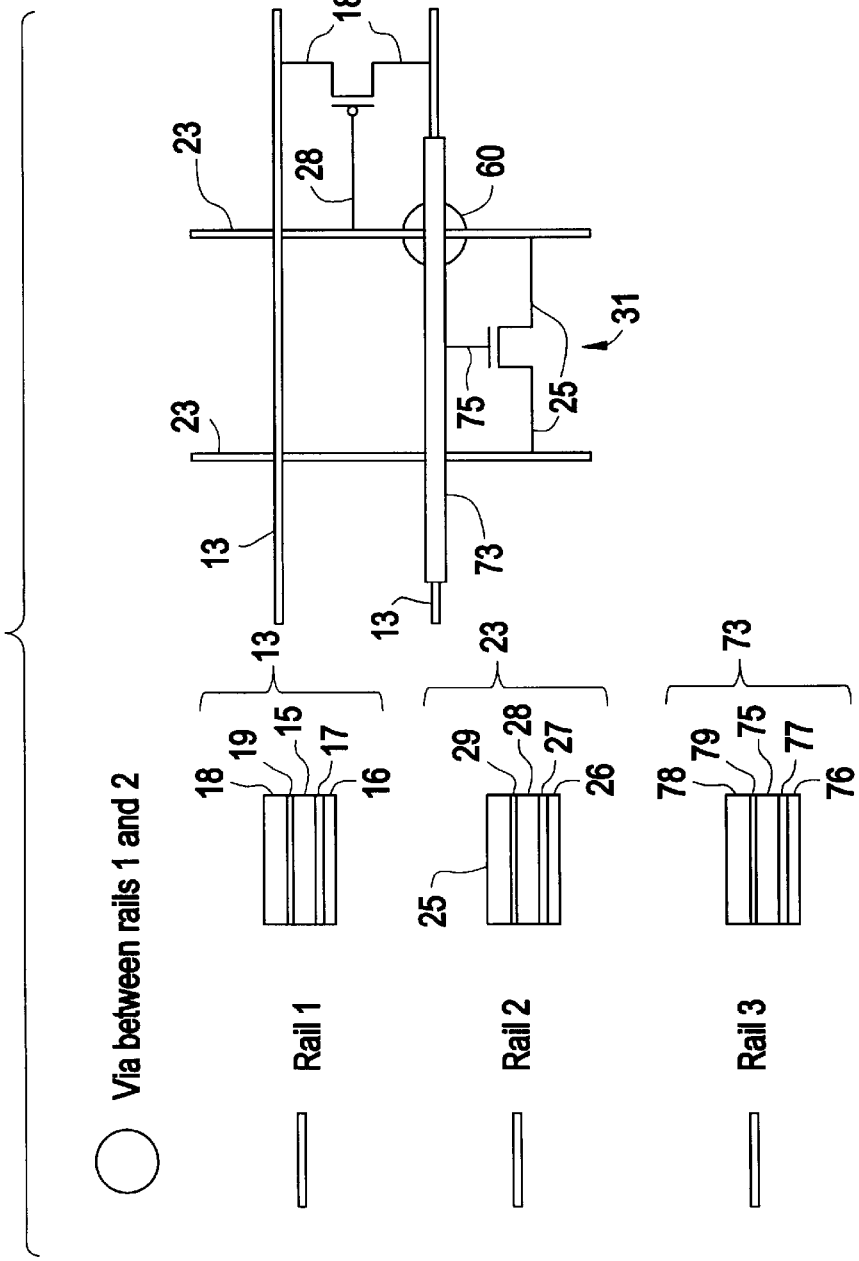

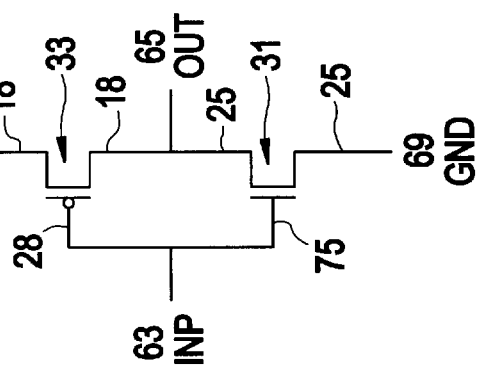
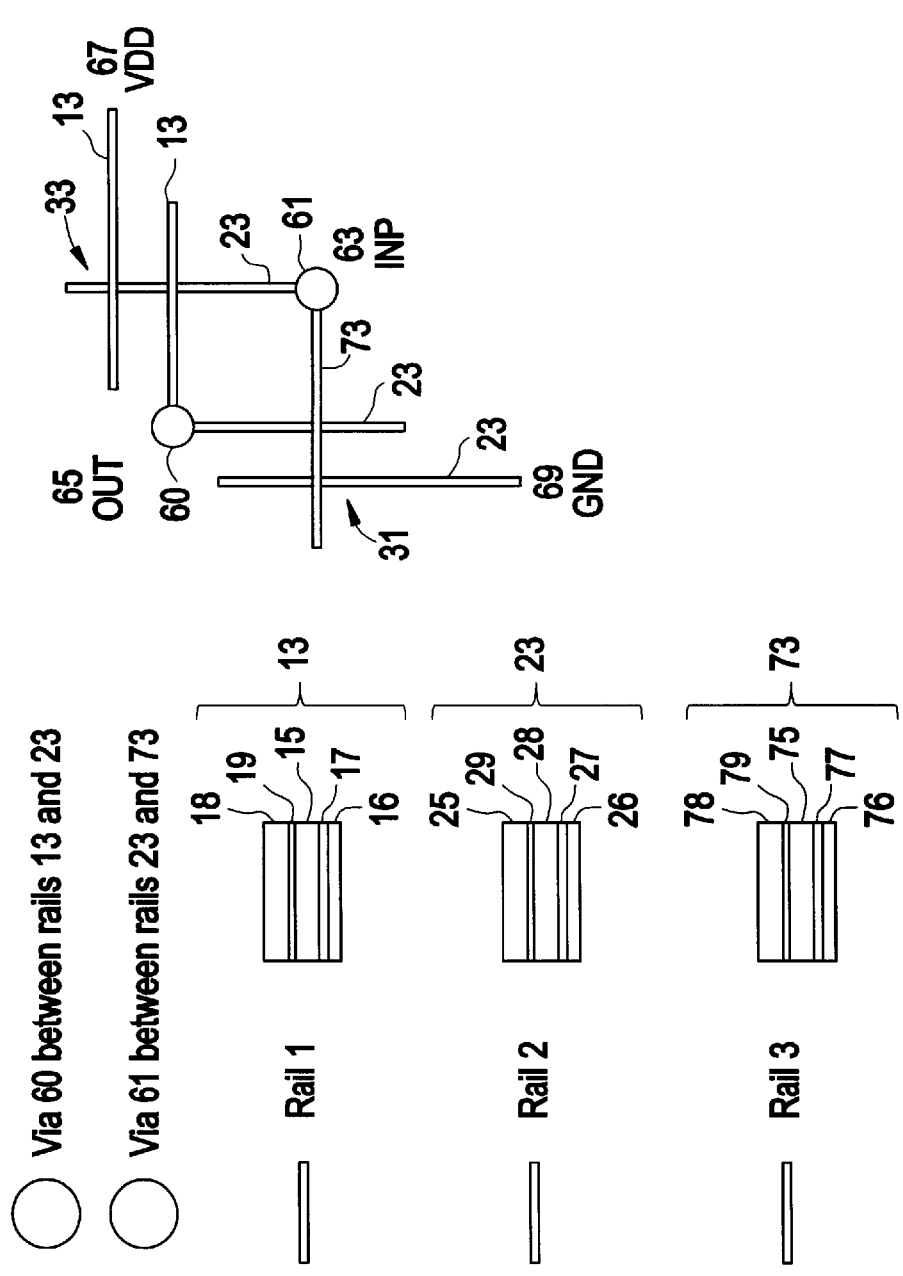
FIG. 5A
FIG. 5B

FIG. 6B
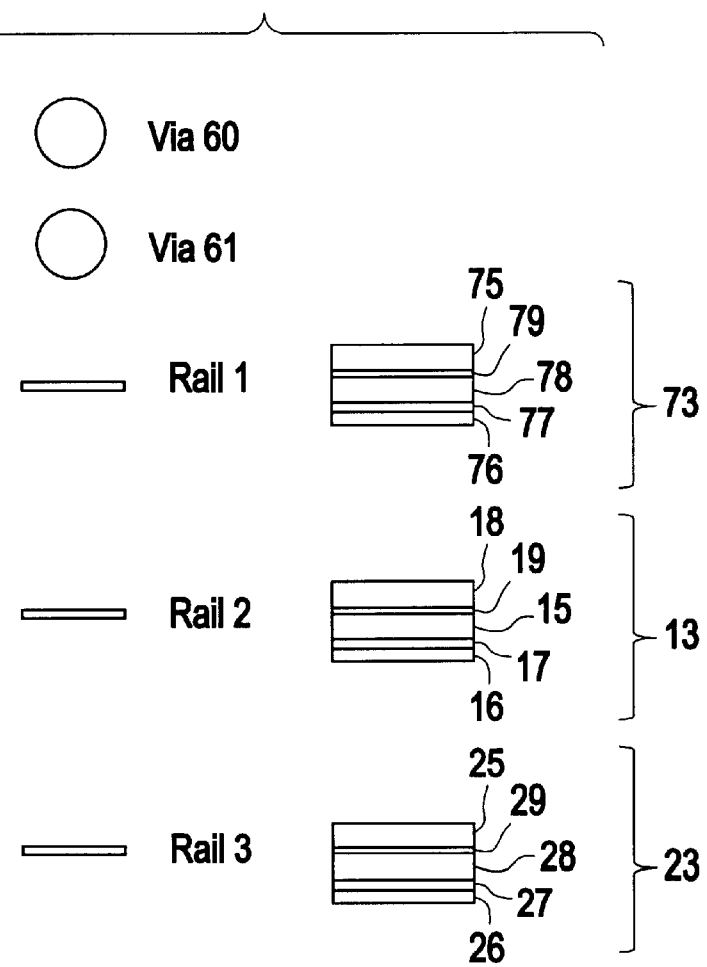
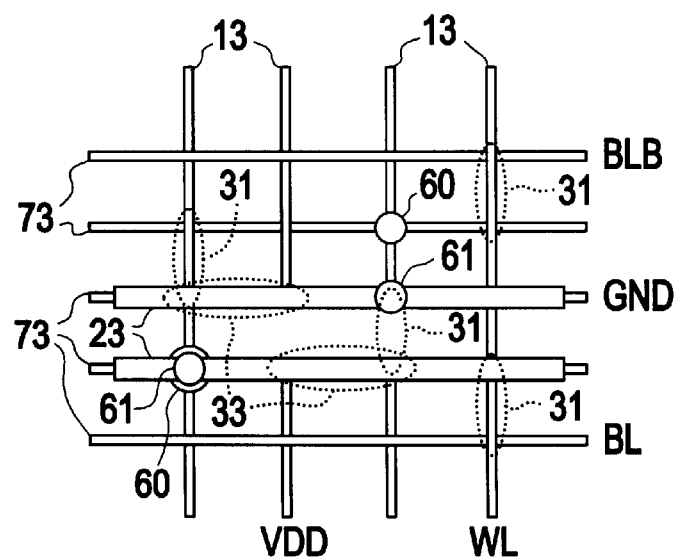

HIGH DENSITY 3D RAIL STACK ARRAYS

FIELD OF THE INVENTION

The present invention is directed generally to semiconductor devices and methods of fabrication and more particularly to three dimensional arrays of thin film transistors and method of fabrication.

BACKGROUND OF THE INVENTION

Thin film transistors (TFTs) are utilized in various devices, such as a liquid crystal displays, static random access memories (SRAMs) and in nonvolatile memories. Conventional TFTs have a structure that is similar to conventional bulk metal oxide semiconductor field effect transistors (MOSFETs), except that TFTs are formed in a semiconductor layer that is located above an insulating substrate, such as a glass substrate or a semiconductor substrate that is covered by an insulating layer. The TFT device density on the substrate is usually lower than desired. The decreased device density increases the device cost, since fewer devices can be made on each substrate. PCT published application WO 02/15277 A2, which corresponds to U.S. application Ser. No. 09/927,648 filed on Aug. 13, 2002, incorporated herein by reference in its entirety, describes how three dimensional rail stack arrays of TFTs may be used utilized to decrease device density.

BRIEF SUMMARY OF THE INVENTION

One preferred aspect of the present invention provides a semiconductor device, comprising a first field effect transistor, comprising (i) a first rail comprising a first channel, a first gate insulating layer and a first gate electrode, (ii) a first source region, and (iii) a first drain region. The device also comprises a second field effect transistor, comprising (i) a second rail comprising a second channel, a second gate insulating layer and a second gate electrode, (ii) a second source region, (iii) a second drain region, wherein the first rail comprises at least one of the second source region or the second drain region.

Another preferred aspect of the present invention provides a monolithic three dimensional array of field effect transistors, comprising (a substrate and a plurality of first rails disposed at a first height relative to the substrate in a first direction, wherein each of the plurality of first rails comprises a first heavily doped semiconductor layer of a first conductivity type. The array also comprises a plurality of second rails disposed in contact with the first rails, at a second height different from the first height, and in a second direction different from the first direction, wherein each of the plurality of second rails comprises a second heavily doped semiconductor layer of the first conductivity type, and a plurality of third rails disposed in contact with the second rails, in the first direction at a third height relative to the substrate such that the second rails are located between the first and the third rails, wherein each of the plurality of third rails comprises a third heavily doped semiconductor layer of the first conductivity type. Portions of the plurality of second rails comprise gate electrodes of a plurality of first field effect transistors and source or drain regions of a plurality of second field effect transistors.

Another preferred aspect of the present invention provides a monolithic three dimensional array of field effect transistors, comprising a substrate and a plurality of first rails disposed at a first height relative to the substrate in a first direction, wherein each of the plurality of first rails comprises a first heavily doped semiconductor layer of a first conductivity type. The array also comprises (c) a plurality of second rails disposed at a second height different from the first height, and in a second direction different from the first direction. Each of the plurality of second rails comprises a second lightly doped semiconductor channel layer of a second conductivity type located in contact with the first rails, a second heavily doped semiconductor layer of the first conductivity type, a second gate insulating layer between the second channel layer and the second heavily doped layer of the first conductivity type, and a second heavily doped semiconductor layer of the second conductivity type electrically connected to the second heavily doped semiconductor layer of the first conductivity type by a metal or a metal silicide layer. The array also comprises a plurality of third rails disposed in the first direction at a third height relative to the substrate. Each of the plurality of third rails comprises a third lightly doped semiconductor channel layer of the first conductivity type located in contact with the second heavily doped layer of the second conductivity type in the second rails, a third heavily doped semiconductor layer of the second conductivity type, a third heavily doped semiconductor layer of the first conductivity type electrically connected to the third heavily doped semiconductor layer of the first conductivity type by a metal or a metal silicide layer, and a third gate insulating layer between the channel layer and the third heavily doped layer of the second conductivity type.

Another preferred aspect of the present invention provides a semiconductor device, comprising a first field effect transistor of a first polarity and a second field effect transistor of a second polarity. A gate electrode of the first transistor is electrically connected to a source or drain of the second transistor without any lateral interconnects.

Another preferred aspect of the present invention provides a monolithic three dimensional memory array of field effect transistors, comprising a substrate and a plurality of first rails disposed at a first height relative to the substrate in a first direction, wherein each of the plurality of first rails comprises a first heavily doped semiconductor layer of a first conductivity type. The array also comprises a plurality of second rails disposed in contact with the first rails at a second height different from the first height, and in a second direction different from the first direction. Each of the plurality of second rails comprises a second heavily doped semiconductor layer of the first conductivity type, a second lightly doped semiconductor channel layer of the second conductivity type, and a second charge storage region located between the second heavily doped semiconductor layer and the second lightly doped semiconductor layer. The array further comprises a plurality of third rails disposed in the first direction at a third height relative to the substrate such that the second rails are located between the first and the third rails. Each of the plurality of third rails comprises a third heavily doped semiconductor layer of the first conductivity type, a third lightly doped semiconductor channel layer of the second conductivity type, and a third charge storage region located between the third heavily doped semiconductor layer and the third lightly doped semiconductor layer. The second lightly doped semiconductor layers in the second rails contact the first heavily doped semiconductor layers in the first rails. The third lightly doped semiconductor layers in the third rails contact the second heavily doped semiconductor layers in the second rails.

Another preferred aspect of the present invention provides a method of making a monolithic three dimensional field effect transistor array, comprising forming a plurality of first rails disposed at a first height relative to a substrate in a first direction, wherein each of the plurality of first rails comprises a first heavily doped semiconductor layer of a first conductivity type, forming a first insulating isolation layer over the first plurality of rails and patterning the first isolation layer to form a plurality of first openings exposing upper portions of first rails. The method further comprises forming a second lightly doped semiconductor layer of a second conductivity type over the patterned isolation layer such that transistor channel portions in the second lightly doped layer of the second conductivity type contact the first heavily doped layer of the first conductivity type through the first openings. The method further comprises forming a second gate insulating layer over the second lightly doped semiconductor layer of the second conductivity type, forming a second heavily doped semiconductor layer of the first conductivity type over the gate insulating layer, and patterning the second heavily doped layer of the first conductivity type, the second gate insulating layer and the second lightly doped layer of the second conductivity type to form a plurality of second rails extending in a second direction different from the first direction.

Another preferred aspect of the present invention provides a monolithic three-dimensional array of active devices comprising odd and even levels of field effect transistors, wherein odd levels comprise transistors of a first polarity, even levels comprise transistors of a second polarity and each transistor comprises a gate electrode, source, and drain, wherein the gate electrodes, sources, and drains of the transistors of at least two levels comprise polysilicon. Current flows between the source and the drain in a first direction through transistors of the first polarity and current flows between the source and the drain in a second direction not parallel to the first direction through transistors of the second polarity.

Another preferred aspect of the present invention provides a semiconductor device, comprising a first transistor having a gate electrode, source, channel, and drain oriented in a first direction, and a second transistor having a gate electrode, source, channel, and drain oriented in a second direction different from said first direction. The gate electrode of said first transistor and the source of said second transistor are disposed in a portion of a first rail.

Another preferred aspect of the present invention provides a semiconductor device a semiconductor device comprising a first rail, the first rail comprising a gate electrode of a first field effect transistor, and a source or drain of a second field effect transistor. The first transistor and the second transistor are oriented in non-parallel directions.

BRIEF DESCRIPTION OF THE DRAWINGS

FIGS. 2–3 are three dimensional views of portions of the array of the first preferred embodiment of the present invention.

FIGS. 4–7 are schematic diagrams illustrating how various circuit elements can be made using the array of the first preferred embodiment.

DETAILED DESCRIPTION OF THE PREFERRED EMBODIMENTS

The present inventors have realized that the device density may be further increased in a rail stack array of TFTs if one rail is contains a gate of one TFT and a source/drain of another TFT.

The Array of the First Preferred Embodiments

Figure 1:
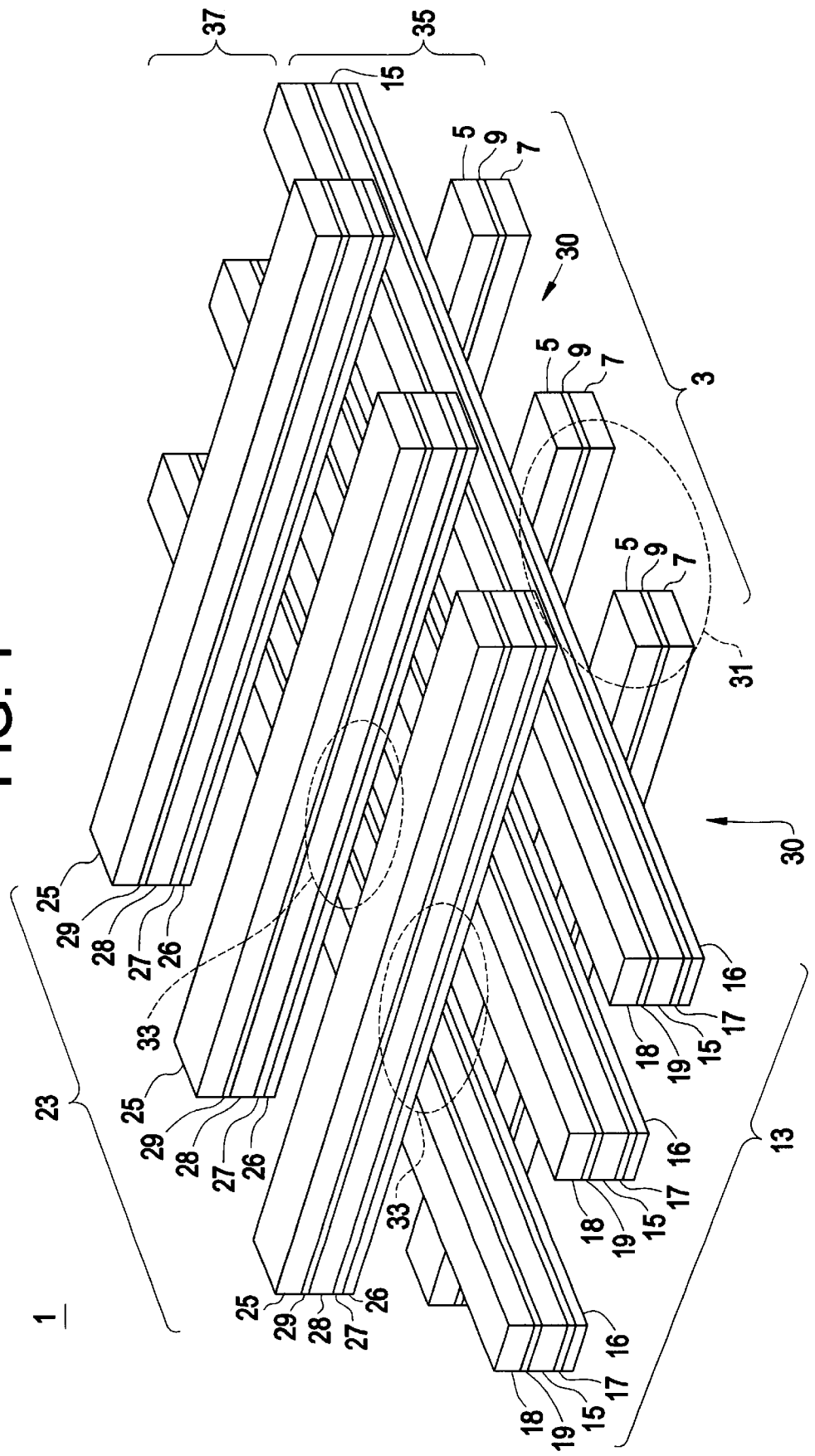
FIG. 1 is a three dimensional view of an array of the first preferred embodiment of the present invention.

FIG. 1 illustrates a monolithic three dimensional array 1 of field effect transistors according to the first preferred embodiment. The array 1 is formed over a substrate (not shown for clarity in FIG. 1). The array contains a plurality of first rails 3 disposed at a first height relative to the substrate in a first direction. For example, the first rails 3 are illustrated in FIG. 1 as being at the lowest height above the substrate and extend diagonally to the left into the page. Of course, any other suitable height and direction may be used instead. Each of the first plurality of rails 3 comprises at least a first heavily doped semiconductor layer of a first conductivity type. For example, if the first conductivity type is n-type, then each first rail 3 comprises an N+ polysilicon layer 5. Of course, the first conductivity type may be p-type, if desired. Preferably, another optional N+ polysilicon layer 7 is located under layer 5 in the first rails 3 and an optional metal or a metal silicide layer 9 is located between layers 5 and 7 to increase the conductivity of the first rails 3.

The array 1 further comprises a plurality of second rails 13 disposed in contact with the first rails 3, at a second height different from the first height. For example, rails 13 may be located directly above rails 3. The second rails 13 are disposed in a second direction different from the first direction. For example, the second rails 13 are illustrated in FIG. 1 extending diagonally to the right into the page. Thus, rails 13 are disposed substantially perpendicular to rails 3, such as at 70–110 degrees, preferably at 80–100 degrees, most preferably at 90 degrees with respect to each other. Of course, any other suitable height and direction may be used instead. Each of the second plurality of rails 13 comprises a second heavily doped semiconductor layer of the first conductivity type 15, such as an N+ polysilicon layer.

The array 1 further comprises a plurality of third rails 23 disposed in contact with the second rails 13, in the first direction (i.e., parallel to the first rails 3 and perpendicular to the second rails 13). However, the third rails 23 may be disposed in another direction that is not parallel to the first direction of the first rails 3. Rails 23 are disposed at a third height relative to the substrate such that the second rails 13 are located between the first 3 and the third rails 13. Each of the third plurality of rails 23 comprises a third heavily doped semiconductor layer of the first conductivity type 25, such as an N+ polysilicon layer.

In the array 1 of the first preferred embodiment, the second rails 13 also contain a second lightly doped semiconductor channel layer 16 of a second conductivity type, such as P− polysilicon layer. Layer 16 is disposed in contact with the first rails 3, such as in contact with N + layers 5 in the first rails 3. The second rails 13 also contain a gate insulating layer 17 between the channel layer 16 and the second heavily doped layer of the first conductivity type 15. The second rails 13 further contain a second heavily doped semiconductor layer of the second conductivity type 18. For example, layer 18 may comprise a P+ polysilicon layer. Layer 18 is electrically connected to the second heavily doped semiconductor layer of the first conductivity type 15 by a metal or a metal silicide layer 19.

In the array 1 of the first preferred embodiment, the plurality of third rails 23 also contain a third lightly doped semiconductor channel layer of the first conductivity type 26, such as an N− polysilicon layer. Layer 26 is disposed in contact with the second heavily doped layer of the second conductivity type 18 in the second rails 13. The third rails 23 also contain a third heavily doped semiconductor layer of the second conductivity type 28. Layer 28 may be a P+ polysilicon layer, for example. Layer 28 is electrically connected to the third heavily doped semiconductor layer of the first conductivity type 25 by a metal or a metal suicide layer 29. A gate insulating layer 27 is disposed between the channel layer 26 and the third heavily doped layer of the second conductivity type 28. Furthermore, a planarized insulating fill layer 30 (shown as white space in FIG. 1) is located between adjacent first, second and third rails.

The rails 3, 13 and 23 are illustrated as having a rectangular cross section. However, the rails 3, 13 and 23 may have any other desired cross section, such as square, triangular, polygonal, oval and/or circular cross section. The cross section may be constant or variable along the length of the rail.

The rails 3, 13, 23 contain a plurality of field effect transistors, such as TFTs at the intersections of the rails. Thus, portions of the plurality of second rails 13 comprise gate electrodes of a plurality of first field effect transistors 31 and source or drain regions of a plurality of second field effect transistors 33.

In the array 1 of the first embodiment, the second heavily doped semiconductor layer of the first conductivity type 15 comprises a gate electrode of the first transistors 31. The second heavily doped semiconductor layer of the second conductivity type 18 comprises a source or drain region of the second transistors 33. The third heavily doped semiconductor layer of the second conductivity type 28 in the third rails 23 comprises a gate electrode of the second transistors 33. The first heavily doped semiconductor layer of the first conductivity type 5 in the first rails 3 comprises a source or drain region of the first transistors 31.

The first 3 and the second 13 rails comprise a first transistor level 35 formed in or above the substrate containing the plurality of first transistors 31. The second 13 and the third 23 rails comprise a second transistor level 37 located above the first level 35 containing the plurality of second transistors 33. Thus, the first 35 and the second 37 levels overlap, and both include the second rails 13.

Each rail 13, 23 contains four layers, including a channel layer, a gate insulating layer and two heavily doped semiconductor layers of opposite conductivity type. The conductivity type of the channel layer switches in each successive rail. Furthermore, the order of the two heavily doped semiconductor layers of opposite conductivity type is reversed in each successive rail. Each transistor level 35, 37 contains TFTs of one conductivity type. The conductivity type of the TFTs is reversed in each succeeding transistor level.

The array 1 is not limited to three sets of rails and two transistor levels. One or more additional sets of rails and transistor levels may be included in the array 1. For example, the array 1 may also include a plurality of fourth rails disposed in the second direction. Thus, the fourth rails are disposed parallel to the second rails and perpendicular to the first and third rails. The fourth rails are disposed at a fourth height relative to the substrate such that the third rails 23 are located between the second 13 and the fourth rails. The fourth rails are the same as the second rails 13 and are omitted from FIG. 1 for clarity.

The third and the fourth rails comprise a third transistor level located above the second level containing the plurality of third transistors. Thus, portions of the plurality of third rails 23 comprise gate electrodes of the second field effect transistors 33 and source or a drain regions of a plurality of third field effect transistors (not shown for clarity). Portions of the fourth rails comprise gate electrodes of the third field effect transistors. Additional rails and transistor levels may be provided in the array as desired, in the same manner as the first four rails. For example, the array 1 may contain three to nine rails and two to eight transistor levels.

Only five rails are needed to form two transistors. Rail one contains the gate and channel of a first transistor and source or drain of a second transistor. Rail two contains the gate and channel of the second transistor. Rail three contains the drain or source of the second transistor. Rails four and five contain the source and drain of the first transistor. This increases the density of the TFTs, since more TFTs may be packed into a given space above the substrate.

Details of one first transistor (i.e., n-type metal oxide semiconductor (NMOS) TFT) 31 and one second transistor (i.e., p-type metal oxide semiconductor (PMOS) TFT) 33 are illustrated in FIG. 2. The first field effect transistor 31 comprises a first gate electrode 41 comprising a portion of one of the second rails 13. Specifically, gate electrode 41 comprises a portion of the N+ polysilicon layer 15. Transistor 31 further contains a first channel region 43 comprising a portion of the first lightly doped semiconductor layer 16 (P− polysilicon layer) located in the same one of the second rails 13 and a portion of the first gate insulating layer 17 as the transistor gate insulating layer. A first source region 45 comprises a portion of the N+ polysilicon layer 5 of one of the first rails 3. A first drain region 47 comprises a portion of the N+ polysilicon layer 5 of another one of the first rails 3. Thus, TFT 31 comprises an NMOS TFT.

The second field effect transistor 33 comprises a second gate electrode 51 comprising a portion of one of the third rails 23. Specifically, gate electrode 51 comprises a portion of the P+ polysilicon layer 28. Transistor 33 further contains a first channel region 53 comprising a portion of the second lightly doped semiconductor layer (N− polysilicon layer) 26 located in the same one of the third rails 23 and a portion of the second gate insulating layer 27 as the transistor gate insulating layer. A second source region 55 comprises a portion of the P+ polysilicon layer 18 in one of the second rails 13. A second drain region 57 comprises a portion of the P+ polysilicon layer 18 in another one of the second rails 13. Thus, transistor 33 is a PMOS TFT. The first 31 and the second 33 transistors comprise top gate staggered TFTs located above an insulating substrate or above an insulating layer formed over a silicon substrate.

The array 1 also contains insulating isolation layers which isolate adjacent transistors from each other, as illustrated in FIG. 2. A first insulating isolation layer 48 is located between the first 3 and the second 13 rails. A second insulating isolation layer 58 is located between the second 13 and the third 23 rails. A plurality of first openings 49 are located in the first isolation layer 48. The second lightly doped semiconductor layer of the second conductivity type 16 (P− polysilicon layer) in the second rails 13 contacts the first heavily doped semiconductor layer of the first conductivity type 5 (N+ polysilicon layer) in the first rails 3 through openings 49. A plurality of second openings 59 are located in the second isolation layer 58. The third lightly doped semiconductor layer of the first conductivity type 26 (N− polysilicon layer) in the third rails 23 contacts the second heavily doped semiconductor layer of the second conductivity type 28 in the second rails 13 through openings 59. Thus, the channel regions of the TFTs are formed in the openings 58, 59, such that the respective insulating isolation layers are adjacent to lateral edges of the respective channel regions to form island channel regions.

FIG. 3 illustrates how individual transistors in array 1 are interconnected to form a logic or memory device. A plurality of vias 60, 61 extend through the first 17 and second 27 gate insulating layers and the first 16 and second 26 channel layers, respectively. The respective heavily doped layers 15, 28 contact the respective heavily doped layers of the same conductivity type 5, 18 in the rails located below through the vias 60, 61. For example, a portion of layer 28 in via 61 acts as an interconnect between the gate 51 and a source 55 or drain 57 of a second transistor 33. This interconnect electrically connects the second and the third rails. Similar vias are formed in other rails to form the desired interconnection.

FIGS. 4 through 6 illustrate some of the circuit elements that may be formed by connecting heavily doped semiconductor layers in adjacent rails through the vias. FIG. 4A illustrates a circuit schematic of two transistor device where a gate electrode 28 of a first transistor 33 of a first polarity (i.e., the PMOS gate electrode) is electrically connected to a source or drain 25 of a second transistor 31 of a second polarity (i.e., the source or drain of the NMOS) without any lateral interconnects. FIG. 4B illustrates a device implementation of the circuit schematic of FIG. 4A. For example, rails 13 in FIG. 4B correspond to the second rails 13 in FIG. 1 and rails 23 correspond to the third rails 23 in FIG. 1. Rails 23 overly rails 13. Rail(s) 73 overly rails 23. The elements in rail(s) 73 are the same as in rails 13. Rail 73 contains an N+ polysilicon layer 75, a P− polysilicon channel layer 76, a gate insulating layer 77, a P+ polysilicon layer and a metal or metal silicide layer 79.

The P+ layer 28 in rail 23 acts as a gate electrode of the PMOS transistor 33, while the N+ layer 25 in the same rail 23 acts as a source or drain of the NMOS transistor 31. Since the gate 28 of the PMOS transistor 33 and the source or drain 25 of the NMOS transistor 31 are located in the same rail 23, the PMOS gate 28 is electrically connected to the NMOS source or drain 25 using metal or metal silicide layer 29 without any lateral interconnects. The N+ layer 75 in rail 73 acts as the gate of the NMOS transistor 31, while the P+ layers 18 in rail 13 act as source and drain regions of the PMOS transistor 33.

FIG. 5A illustrates a circuit schematic of two transistor inverter, such as a complementary metal oxide semiconductor (CMOS) inverter. FIG. 5B illustrates a device implementation of the circuit schematic of FIG. 5A. For example, rails 13 in FIG. 5B correspond to the second rails 13 in FIG. 1 and rails 23 correspond to the third rails 23 in FIG. 1. Rail(s) 73 are the same as that shown in FIG. 4B. Rails 23 overly rails 13. Rail(s) 73 overly rails 23.

The inverter contains an input 63 into the NMOS 31 and PMOS 33 gate electrodes and an output 65 from the drains of the NMOS 31 and PMOS 33. The source of the PMOS is connected to voltage VDD 67 while the source of the NMOS is connected to ground 69. A first via 60 between rails 13 and 23 allows an electrical connection to be made between the P+ layer 18 in rail 13 acting as a drain of PMOS 33 and the N+ layer 25 in rail 23 acting as a drain of the NMOS 31. A second via 60 between rails 23 and 73 allows an electrical connection to be made between the P+ layer 28 in rail 23 acting as a gate of PMOS 33 and the N+ layer 75 in rail 73 acting as a gate of the NMOS 31. The P+ layer 18 in another rail 13 which acts as a source of the PMOS 33 is connected to voltage VDD 67, while the N+ layer 25 in another rail 23 which acts as the source of the NMOS is connected to ground 69. In the inverter, the gate of the PMOS 33 is located in rail 23 which does not contain a source or drain of the NMOS 31. Thus, three rails 23 are used to form a two transistor inverter.

Figure 6A:
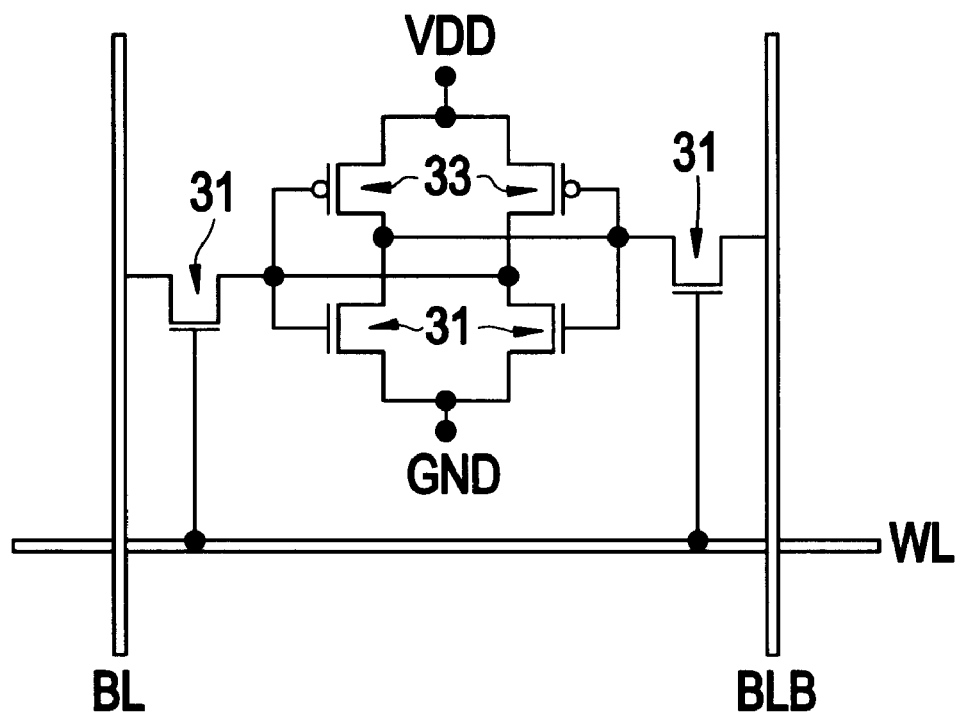

FIG. 6A illustrates a circuit schematic of a six transistor CMOS static random access memory (CMOS SRAM). FIG. 6B illustrates a device implementation of the circuit schematic of FIG. 6A. For example, rails 13 in FIG. 6B correspond to the second rails 13 in FIG. 1 and rails 23 correspond to the third rail 23 in FIG. 1. Rail(s) 73 are the same as rails 23. Rails 13 overly rails 73. Rails 23 overly rails 13. The gate electrodes of the two NMOS access transistors 31 are connected to the common word line WL, while their drains are connected to bit lines BL and BLB. The drains of the load PMOS transistors 33 are connected to voltage VDD while the drains of the NMOS driver transistors 31 are connected to ground GND. Vias 60 between rails 73 and 13 and vias 61 between rails 13 and 23 provide the connections to form the SRAM.

Figure 7:
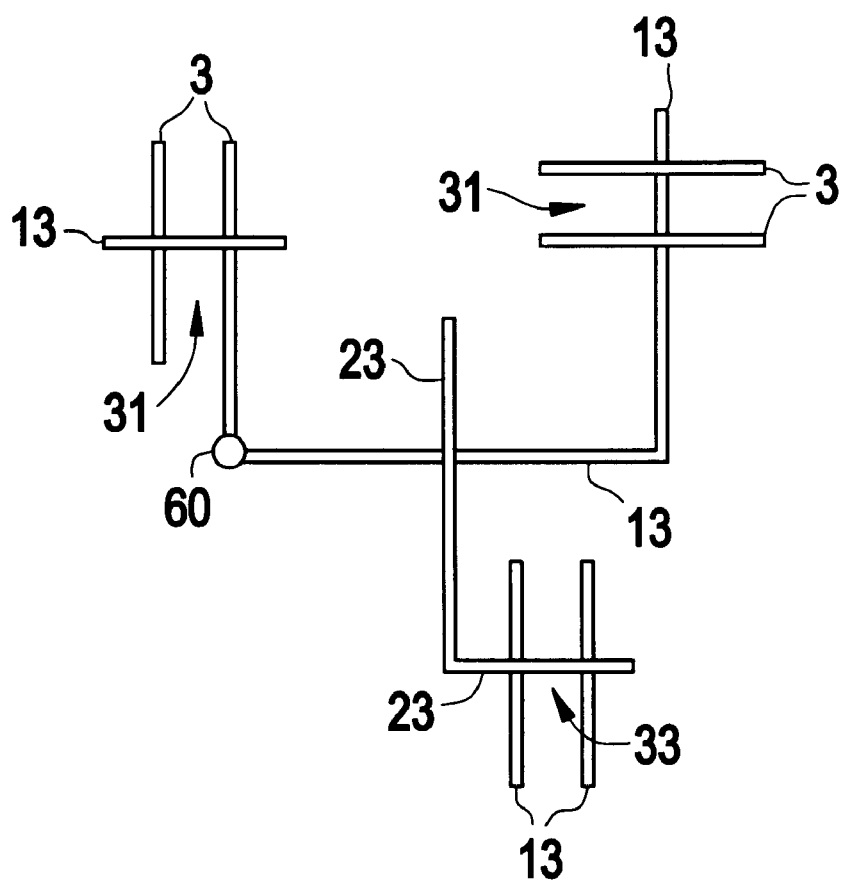

The rails 3, 13, 23, 73 have been illustrated in FIGS. 1 and 4–6 as extending in a single direction. However, the direction of rails may change over different regions of the substrate, as illustrated in FIG. 7. For example, the rails may extend in one direction over one portion of the substrate, and then extend in another direction over a different portion of the substrate. Thus, the transistors located in the same transistor level may be oriented in different directions if desired.

Furthermore, the rails are preferably continuous and have no gaps or discontinuities. However, if desired, the rails may be discontinuous and may contain one or more gaps or discontinuities, as shown in FIG. 7. The rails have also been illustrated as having a rectangular cross section. However, if desired, the rails may have any other desired polygonal, oval or circular cross section. Furthermore, while the rails preferably have the same cross sectional dimensions and shape along their entire length, these dimensions and shape may vary along the length of the rails if desired.

The Array of the Second Preferred Embodiment

Figure 8:
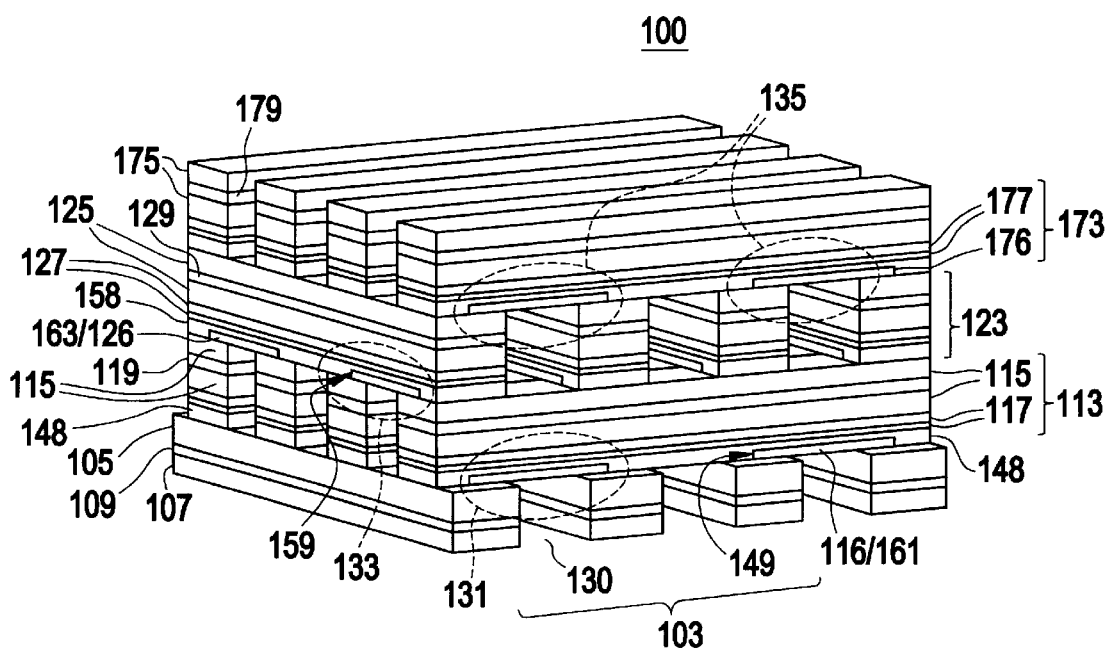
FIGS. 8 and 9 are three dimensional views of an array of the second preferred embodiment of the present invention.

FIG. 8 illustrates a three dimensional array 100 of devices according to the second preferred embodiment of the present invention. The array 100 differs from array 1 in that the heavily doped semiconductor layer of the second conductivity type is omitted from each rail. Thus, each transistor level contains transistors of the same conductivity type. In contrast, the array 1 contains transistors of different conductivity type. Furthermore, in the array 100, the heavily doped semiconductor layer of the same conductivity type in each rail serves as a gate of one transistor and a source or drain of another transistor. In contrast, in array 1, different heavily doped semiconductor layers of opposite conductivity type in the same rail serve as a gate of one transistor and a source or drain of another transistor. Therefore, array 1 is preferably used as an array of logic devices, while array 100 is preferably uses as an array of memory devices, such as an array of charge storage devices (i.e., programmable read only memory (PROM), electrically programmable read only memory (EPROM) or electrically erasable programmable read only memory EEPROM). In the case of EPROM and EEPROM, each transistor in the array 100 contains a charge storage region. However, if desired, the array 1 may also be used in an EPROM or EEPROM.

Thus, in the array 100, a plurality of first rails 103 are disposed at a first height relative to the substrate in a first direction. Each of the first plurality of rails 103 comprises a first heavily doped semiconductor layer of a first conductivity type 105, such as an N +polysilicon layer. Preferably, another optional N+ polysilicon layer 107 is located under layer 105 in the first rails 103 and an optional metal or a metal silicide layer 109 is located between layers 105 and 107 to increase the conductivity of the first rails 103.

A plurality of second rails 113 are disposed in contact with the first rails 103 at a second height different from the first height, and in a second direction different from the first direction. Each of the second plurality of rails 113 comprises a second heavily doped semiconductor layer of the first conductivity type 115, such as an N+ polysilicon layer and a second lightly doped semiconductor channel layer of the second conductivity type 116, such as a P− polysilicon layer.

Each second rail also contains a second gate insulating layer. Preferably, the array 100 contains charge storage transistors, and the second gate insulating layer comprises a portion of second charge storage region 117 located between and in contact with the second heavily doped semiconductor layer 115 and the second lightly doped semiconductor layer 116. The second charge storage region 117 comprises one of a dielectric isolated floating gate, a silicon oxide/silicon nitride/silicon oxide (ONO) dielectric film, an insulating layer containing conductive nanocrystals or any other desired charge storage material.

The array 100 also contains a plurality of third rails 123 disposed in the first direction at a third height relative to the substrate, such that the second rails 113 are located between the first 103 and the third 123 rails. Each of the third plurality of rails 123 comprises a third heavily doped semiconductor layer of the first conductivity type 125, such as an N+ polysilicon layer and a third lightly doped semiconductor channel layer of the second conductivity type 126, such as a P− polysilicon layer. The third rails 123 also comprise a third gate insulating layer. Preferably, the array 100 contains charge storage transistors, and the third gate insulating layer comprises a portion of a third charge storage region 127 located between and in contact with the third heavily doped semiconductor layer 125 and the third lightly doped semiconductor layer 126. Charge storage region 127 may comprise one of a dielectric isolated floating gate, an ONO dielectric film, an insulating layer containing conductive nanocrystals or any other desired charge storage material.

The second lightly doped semiconductor layer 116 in the second rails 113 contacts the first heavily doped semiconductor layer 105 in the first rails 103. The third lightly doped semiconductor layer 116 in the third rails 123 contacts the second heavily doped semiconductor layer 125 in the second rails 123.

A plurality of first 131 and second 133 transistors are formed above each other in array 100 similar to the first array 1. Each rail except the top and the bottom rail is part of two transistor levels.

Similar to the array 1 of the first preferred embodiment, the array 100 of the second preferred embodiment contains a first insulating isolation layer 148 located between the first rail 103 and the second rail 113. The first insulating isolation layer 148 is located in the second rails below a first charge storage region 117 adjacent to lateral edges of the first channel regions to form an island first channel regions 161. A plurality of first openings 149 are located in the first insulating isolation layer 148, with the island channel regions 161 being disposed in the openings 149.

A second insulating isolation layer 158 is located between the second rail 113 and the third rail 123. The second insulating isolation layer 158 is located in the third rails below the second charge storage region 127 adjacent to lateral edges of a second channel regions to form island second channel regions 163. A plurality of second openings 159 are located in the second insulating isolation layer 158, with the island channel regions 163 being disposed in the openings 159.

A plurality of first transistor 131 island channels 161 comprise portions of the second lightly doped semiconductor layer 116 located in the first openings 149. The first transistor island channels 161 contact the first heavily doped semiconductor layer 105 in the first rails 103. First transistor bit lines comprise the first heavily doped semiconductor layer 105 in the first rails 103. First transistor word lines comprise the second heavily doped semiconductor layer 115 in the second rails 113.

A plurality of second transistor 133 island channels 163 comprise portions of the third lightly doped semiconductor layer 126 located in the second openings 159. The second transistor island channels 163 contact the second heavily doped semiconductor layer 115 in the second rails 113. The second transistor bit lines comprise the second heavily doped semiconductor layer 115 in the second rails 113. The second transistor word lines comprise third heavily doped semiconductor layers 125 in the third rails 123.

In addition, the array 100 contains a plurality of fourth rails 173 disposed in contact with the third rails 123. The fourth rails 173 are disposed at a fourth height above the third rails 123 and extend in the second direction, parallel to the second rails 113. Each of the plurality of fourth rails comprises a fourth heavily doped semiconductor layer of the first conductivity type 175, a fourth lightly doped semiconductor layer of the second conductivity type 176 and a fourth charge storage region 177 located between and in contact with layers 175 and 176. As with the array 1 of the first embodiment, a third plurality of TFTs 135 are located in a third transistor level encompassing the third 123 and fourth 173 rails.

A planarized insulating fill layer 130 is located between adjacent rails. If desired, an optional metal or metal silicide layer 109, 119, 129 may be provided inside the heavily doped semiconductor layers 105, 115 and 125. In this case, the heavily doped semiconductor layers 105, 115 and 125 comprise upper and lower sublayers separated by the metal or metal silicide layer.

Using the architecture of FIG. 8, the memory density is improved to an effective cell size of $8f^2/(n-1)$, where n is the number of semiconductor layers. The dual purpose of heavily doped semiconductor layers as gates and source/drains provides for a different implementation of the erase and read/write steps. Traditional row and column circuits are optimized to perform single operations, whereas the architecture illustrated in FIG. 8 provides that row and column operations to both erase as well as read/write.

The Method of Biasing the Array of the Second Preferred Embodiment to Write, Read and Erase Data The method of biasing the memory array 100 shown in FIG. 8 to make read, write and erase operations will now be explained with reference to FIG. 9. While absolute biases across transistors will be illustrated for clarity of explanation, the biasing of the array may be implemented as a sum of positive and negative potentials with respect to ground. The primary mechanism of write and erase operations in the array 100 of is carrier tunneling, such as Fowler-Nordheim or modified Fowler-Nordheim tunneling, where the injection current has a near-exponential dependence on the applied voltage. Hence, an inhibit voltage, which is lower than the write or erase voltage, can be applied to non-selected transistors in array 100 without significantly disturbing the stored value in these transistors.

Figure 9:
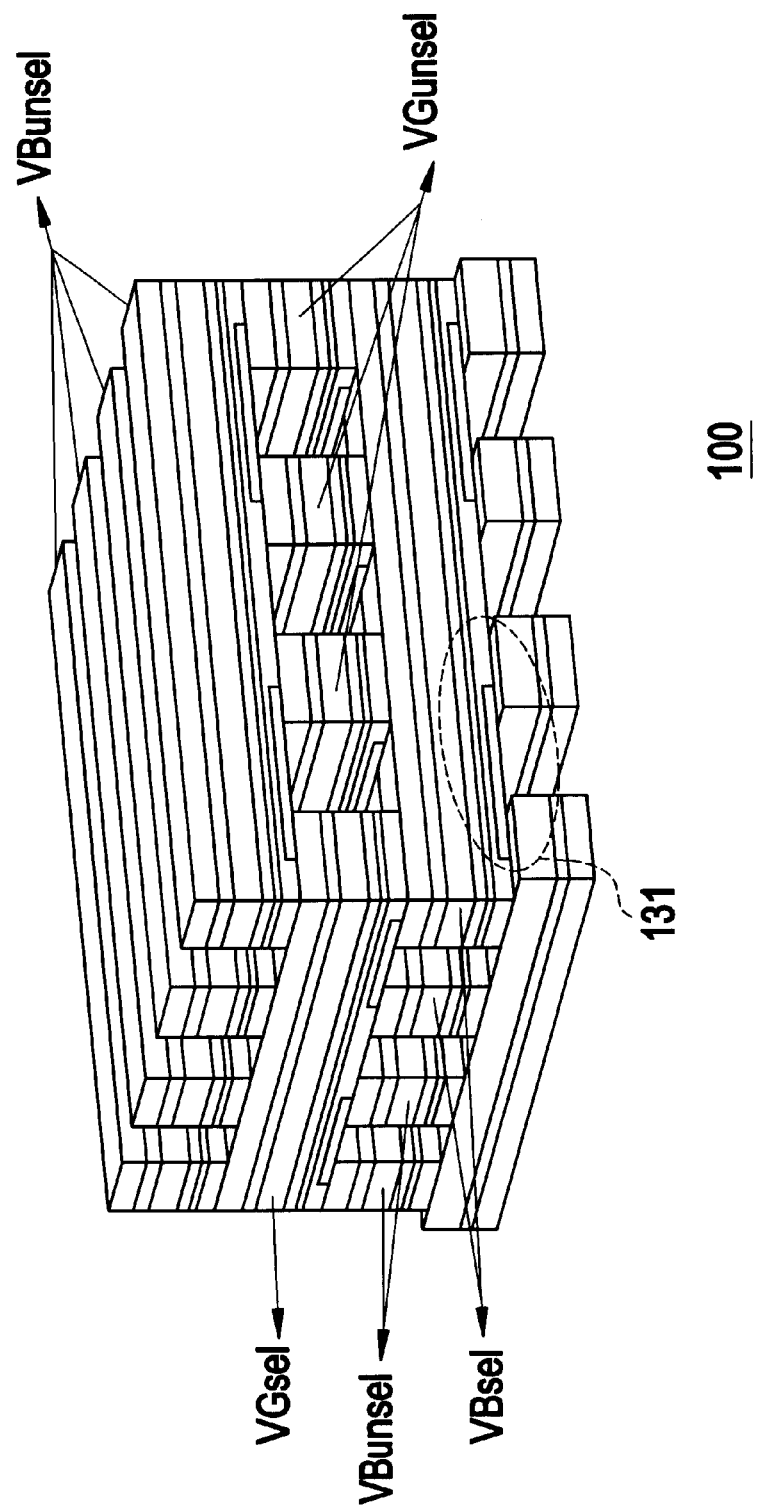

FIG. 9 illustrates the naming convention of the voltages applied to the array 100 when writing, reading or erasing data to and from the selected transistor 131 (circled in FIG. 9). Specifically, VGsel is the gate voltage for the selected transistor. VBsel is the bit line voltage for the selected transistor. VGunsel is gate voltage for the unselected transistors. VBunsel is the bit line voltage for the unselected transistors.

The write operation to the targeted or selected transistor 131 having its gate in one third rail 123 and its source and drain in adjacent second rails 113 in array 100 is as follows. A high programming voltage, VPP, is provided to the gate of the targeted transistor 131 with its drain and source grounded. All other third rails 123 are biased at Vinhbtg, the gate inhibit voltage. This prevents unintentional programming of the cells sharing the same bit lines with the programmed transistor 131. VPP is a voltage across the gate that will program a cell, while Vinhbtg is a voltage that will not. All bit lines in rails 113 except for the rails which act as the source and drain of the programmed transistor 131 are maintained at Vinhbtb, the bit line inhibit voltage. Vinhbtb is a voltage applied to the bit lines of a magnitude such that applying VPP to the selected word line will not program transistors underneath this word line. Thus, voltages Vinhbtg and Vinhbtb are lower than voltage VPP. All first rails 103 and fourth rails 173 are biased Vinhbtb.

The exemplary voltages applied to the array 100 for a write operation to the selected transistor 131 are illustrated in Table 1 below. Of course other specific voltages values may be used instead, as long as the relationship of the different voltages (i.e., ground, float, low and high) remain the same.

TABLE 1

| VGsel | VPP (10 V) |
|---|---|
| VBsel | Ground (0 V) |
| VGunsel | Vinhbtg (5 V) |
| VBunsel | Vinhbtb (5 V) |

The erase operation of the targeted or selected transistor 131 having its gate in one third rail 123 and its source and drain in adjacent second rails 113 in array 100 is as follows. The gate of the targeted transistor 131 in rail 123 is grounded (zero volts are applied to the gate) and a high erase voltage, VEE, is applied to the source and drain located in adjacent second rails 113 of targeted transistor 131. All other third rails 123 are biased at Vinhbtg to inhibit erase of other transistors at the same level as the targeted transistor 131. All other second rails 113 are biased at Vinhbtb to prevent erasing of the non-targeted transistors. VEE is sufficient to erase a transistor, while Vinhbtb is not. Thus, voltage VEE is higher than voltages Vinhbtb and Vinhbtg. The above described bias condition is suitable for erasing a single transistor (i.e., cell or bit). To erase the contents of an entire block of transistors, voltage VEE is applied to all bit lines of the selected block of transistors. This will erase all the cells controlled by the select gate simultaneously. Depending on the selected scheme, lines in other rails can be either grounded or left at Vinhbtb.

The exemplary voltages applied to the array 100 for an erase operation to the selected transistor 131 are illustrated in Table 2 below. Of course other specific voltages values may be used instead, as long as the relationship of the different voltages (i.e., zero or float, low and high) remain the same.

TABLE 2

| VGsel | Ground (0 V) |
|---|---|
| VBsel | VEE (10 V) |
| VGunsel | Vinhbtg (5 V) |
| VBunsel | Vinhbtb (5 V) |

The read operation of the targeted or selected transistor 131 having its gate in one third rail 123 and its source and drain in adjacent second rails 113 in array 100 is as follows. The read operation is performed by sensing the current between the drain and source terminals of the targeted transistor 131. The control gate of the targeted transistor 131 is raised to the appropriate voltage, VRDG, while biasing the drain and source of the transistor to VRDD and VRDS, respectively. The exact values of these voltages depend on the device characteristics and their statistical distribution. For example, voltage VRDG may be about 2–3V, voltage VRDD may be about 2V and voltage VRDS may be about 0.5V. Voltages VRDG and VRDD are higher than voltage VRDS. Voltages VRDG, VRDD and VRDS are lower than the voltages required to program and erase the transistor. All other rails are left to float.

The exemplary voltages applied to the array 100 for a read operation to the selected transistor 131 are illustrated in Table 3 below. Of course other specific voltages values may be used instead, as long as the relationship of the different voltages (i.e., zero or float, low and high) remain the same.

TABLE 3

| VGsel | VRDG |
|---|---|
| VBsel | VRDD/VRDS |
| VGunsel | Float |
| VBunsel | Float |

Thus, in summary, a predetermined transistor of the memory array is programmed by applying a high programming voltage to the transistor's word line, grounding the transistor's bit lines and applying a low programming inhibiting voltage to unselected word lines and bit lines. This transistor is erased by applying a high erase voltage to the transistor's bit lines, grounding the transistor's word line and applying a low erase inhibiting voltage to the word lines in the same transistor level as the predetermined transistor's word line and to the bit lines in the same transistor level as the predetermined transistor's bit lines. This transistor is read by applying a first low read voltage to the transistor's word line and drain bit line, applying a second read voltage which is lower than the first read voltage to the transistor's source bit line, allowing the word lines in the same transistor level as the predetermined transistor's word line and the bit lines in the same transistor level as the predetermined transistor's bit lines to float, and sensing a current between the predetermined transistor's bit lines.

Preferred Features of the Arrays of the First and Second Embodiments

Preferably, the arrays 1 and 100 comprise monolithic three dimensional arrays of devices. The term "monolithic" means that layers of each level of the array were directly deposited on the layers of each underlying level of the array. Thus, the first rails 3, 103 are monolithically located above the substrate, the second rails 13, 113 are monolithically located on the first rails 3, 103, the third rails 23, 123 are monolithically located on the second rails 13, 113, and the fourth rails 173 are monolithically located on the third rails 123. Less preferably, two dimensional arrays may be formed separately and then packaged together to form a three dimensional non-monolithic device array.

As shown in FIGS. 1 and 8, odd transistor levels comprise transistors 31, 131 of a first polarity (i.e., level 35 shown in FIG. 1 comprises NMOS transistors), while even transistor levels comprise transistors 33, 133 of a second polarity (i.e., level 37 comprises PMOS transistors). Some or all transistors in different levels are oriented in different directions. Thus, current flows between the source and the drain in a first direction through transistors 31 of the first polarity, while current flows between the source and the drain in a second direction not parallel to the first direction through transistors 33 of the second polarity. Preferably, the second direction is substantially orthogonal to the first direction. Thus, the first and the second transistors are disposed in different directions even when the gate electrode of the first transistor and the source or drain of the second transistor are disposed in a portion of the same rail.

The arrays 1 and 100 were illustrated as having top gate staggered TFTs. However, if desired, the arrays 1 and 100 may be formed to contain bottom gate staggered TFTs. In this case, arrays 1 and 100 are formed upside down (i.e., the order of formation of the rails is reversed) over the substrate. Of course, a three dimensional monolithic array may comprise both top gate and bottom gate TFTs, such as having one level of the array containing top gate TFTs and another level of the array containing bottom gate TFTs.

The arrays 1, 100 were illustrated as comprising TFTs. However, if desired, the first rails 5 may be formed in a single crystal silicon substrate, such that the first transistors 31 comprise bulk silicon MOSFETs. Furthermore, arrays 1 and 100 may be incorporated into the same device if desired. Thus, array 1 may be formed above, below or adjacent to array 100 on the same substrate. If desired, the conductivity types of each semiconductor layer may be reversed (i.e., p and n type switched).

Preferably, the semiconductor layers described above comprise polysilicon, but may comprise amorphous silicon or other semiconductor materials if desired. Preferably, the gate insulating layers and isolation layers comprise an insulating layer, such as silicon dioxide, silicon oxynitride, silicon nitride or aluminum oxide. Preferably, the planarized insulating fill layer 30, 130 comprises a silicon dioxide, silicon oxynitride, silicon nitride, spin-on glass, borophosphosilicate glass (BPSG), PSG or BSG layer. The metal layers 9, 19 and 29 may comprise aluminum, copper, tungsten or titanium (including titanium nitride). The metal silicide layers 9, 19 and 29 may comprise any silicide, such as titanium, tungsten, cobalt, platinum or nickel silicide. The substrate may comprise a semiconductor substrate, such as a monocrystalline silicon or a gallium arsenide substrate or an insulating substrate, such as a glass, quartz, plastic or ceramic substrate. If desired, an insulating layer, such as silicon dioxide, silicon oxynitride, silicon nitride or aluminum oxide, may be formed over the substrate.

The arrays 1, 100 may be used in any device or system, such as a liquid crystal display (either in the driver or in the active matrix portion), in a logic device or in a memory device, such as an SRAM, a dynamic random access memory (DRAM) or a nonvolatile read only memory ("ROM"), such as a PROM (i.e., mask ROM), EPROM or EEPROM.

Method of Making the Arrays of the first and Second Embodiments

The arrays 1 and 100 may be made by any desired method. A preferred method of making monolithic three dimensional arrays 1 and 100 is illustrated in FIGS. 10A–D. All layers may be deposited by any desired method, such as chemical vapor deposition, sputtering, molecular beam epitaxy, etc. All patterning steps may be carried out by photolithography and wet or dry etching. Element numbers in FIGS. 10A–D refer to the elements in array 1 of FIG. 1 for explanation. However, the method of FIGS. 10A–D may be used to form the array 100 shown in FIG. 8 instead, as will be described below.

Figure 10A:
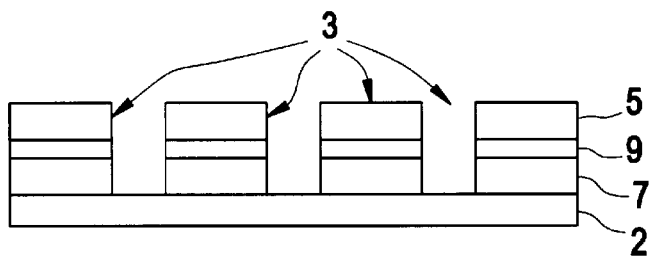
FIGS. 10A–D are side cross sectional views of steps in a method of making of an array of the preferred embodiments of the present invention.

A plurality of first rails 3 are formed in or over a substrate 2. For example, the first rails 3 may be formed by depositing a first N+ or P+ polysilicon layer 7, a metal or metal silicide layer 9, such as titanium or cobalt and a second N+ or P+ polysilicon layer 5, in that order, over a substrate 2. Layers 5 and 7 may be in-situ doped during deposition or doped after deposition by ion implantation. A photoresist mask is formed over layer 5 and layers 5, 7 and 9 are then etched to form the first rails 3, as shown in FIG. 10A. If desired, the rails 3 may be annealed at any time in the process to react the metal layer 9 with the adjacent polysilicon layers to form a metal silicide layer.

A first insulating fill layer 30 is then deposited over and between the first rails 3. Layer 30 is then polished by chemical mechanical polishing using the first rails 3 as a polish stop to expose the first rails 3. Layer 30 remains between the rails 3. Alternatively, layer 30 may be planarized with the top portions of the first rails 3 using etchback instead of polishing.

Figure 10B:
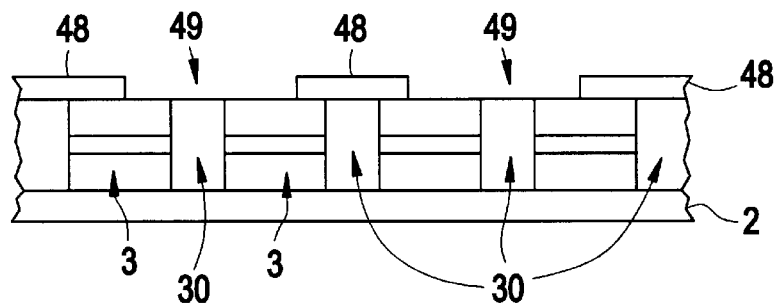

A first insulating isolation layer 48 is then deposited over the first plurality of rails 3 and over the planarized fill layer 30. The first isolation layer 48 is then patterned by photolithography and etching to form a plurality of first openings 49 exposing upper portions of adjacent first rails 3, as illustrated in FIG. 10B.

Alternatively, deposition of a separate isolation layer 48 may be omitted if desired. Instead, the upper portion of the fill layer 30 may be left over the rails 3 to function as the isolation layer. The openings 49 are then formed in the upper portion of the fill layer 30 to expose the first rails 3.

Figure 10C:
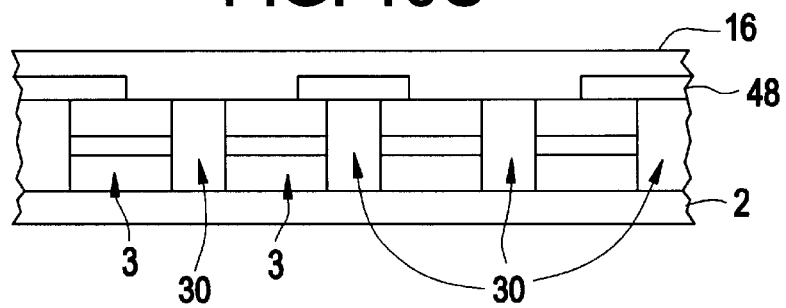

A second lightly doped semiconductor layer 16 of a opposite conductivity type to layer 5 is formed over the patterned isolation layer 48, as illustrated in FIG. 10C. For example, layer 16 comprises P– polysilicon or amorphous silicon layer if layer 5 comprises an N+ polysilicon layer. Layer 16 may be doped in-situ or by ion implantation. If desired, layer 16 may be annealed at any time during the process to recrystallize the amorphous silicon into polysilicon or to increase the grain size of the as-deposited polysilicon layer. Annealing may also be optionally used to outdiffuse dopants from layer 5 into layer 16 to form source and drain regions which extend from layer 5 into layer 16. Layer 16 may be annealed in a furnace or by using laser or flash lamp irradiation. If desired, an optional metal or metal silicide catalyst material may be used to increase the polysilicon grain size and to allow the use of a lower annealing temperature.

Portions of layer 16 located in openings 49 comprise transistor channel. As shown in FIG. 10C, layer 16 extends over layer 48 without interruption. However, if desired, layer 16 may be optionally etched or polished to expose the top portion of layer 48, such that portions of layer 16 are located only in the openings 49. This polishing or etchback step allows formation of discrete channel islands. The discrete channel islands 161 are preferred in the array 100 of the second embodiment. In another alternative method of making channel island regions, the channel layer 16, 116 is formed on rails 3, 103 and fill layer 30. Layer 16, 116 is then photolithographically patterned into channel islands 161 prior to forming the isolation layer 48, 148. The isolation layer 48, 148 is then formed between and over the channel islands 161. Layer 48, 148 may be planarized to expose the channel islands, or less preferably, a top portion of layer 48, 148 remaining over channel islands may be used as a gate insulating layer A gate insulating layer 17 is formed over layer 16. If it is desired to form charge storage transistors 131, then the gate insulating layer 17 comprises a portion of a charge storage regions, such as an oxide/nitride/oxide film, a dielectric insulated floating gate or conductive nanocrystals embedded in an insulating layer.

If it is desired to form contacts between different rails, then an additional photoresist mask is formed over layer 17.

Layers 17 and 16 are then etched to form vias 60 extending to N+ polysilicon layer 5 in the first rail 3, as shown in FIG. 3.

Figure 10D:
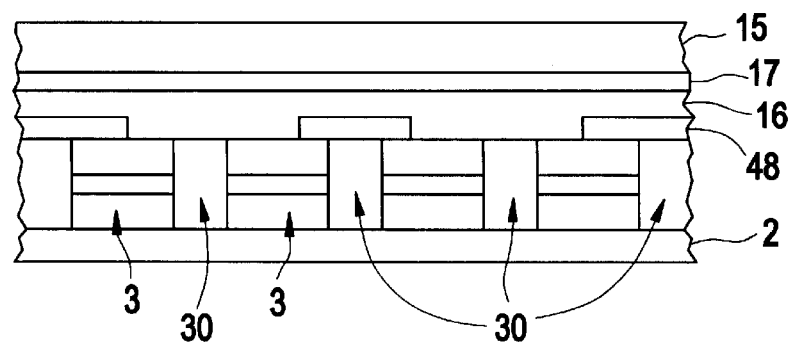

A second heavily doped semiconductor layer 15 of the first conductivity type is formed over the gate insulating layer 17, as shown in FIG. 10D. Preferably, layer 15 is an N+ polysilicon layer if layer 16 is a P− layer, and vice-versa. Layer 15 may be doped in-situ or by ion implantation. If vias 60 are present in layers 16 and 17, then portions of the as-deposited layer 15 contact layer 5 in the first rails 3 through the vias 60.

A photoresist mask is then formed over the layers 15, 17 and 16 and these layers are etched to form a plurality of second rails 13, as shown in FIG. 1. These layers may be etched during one etching step or during plural sequential etching steps, as desired. Alternatively, only layers 15 and 17 may be etched without etching the channel layer 16. For example, since the channel layer 16 is undoped or lightly doped, it may remain as a continuous unpatterned layer between adjacent rails. The active transistor regions are formed where channel layer 16 extends through the openings 49 in the isolation layer 48 to the first rails 3.

These steps are then repeated to form additional rails 23, 73 over the second rails 13. For example, a second insulating fill layer is formed between the second rails 13. This layer is polished to expose the second rails 13. A second insulating isolation layer 58 is formed over the plurality of second rails 13, as shown in FIG. 2. Layer 58 is patterned to form a plurality of second openings 59 exposing upper portions of adjacent second rails 13. A third lightly doped semiconductor layer 26 is formed over the patterned second isolation layer 58, such that transistor channel portions in layer 26 contact the second rails 13 through the second openings 59, as shown in FIG. 2. A gate insulating layer 27 is formed over layer 26. If desired, vias 61 are formed in layers 26 and 27 to allow connection between the second rails 13 and the third rails 23. A third heavily doped semiconductor layer 25 is formed over the gate insulating layer 27. Layers 25, 26 and 27 are patterned to form a plurality of third rails 23, as shown in FIG. 1. Alternatively, layer 26 is not patterned and extends between adjacent second rails. A third insulating fill layer is formed between the third rails and polished to expose the third rails 23.

The method illustrated in FIGS. 10A–D may be modified depending on what type of array is being fabricated. If the array 1 illustrated in FIG. 1 is being fabricated, then the conductivity type of the lightly doped channel layer in each set of rails is reversed. Thus, if layer 16 is p-type, then layer 26 is n-type. Furthermore, each rail except the first rail contains two heavily doped polysilicon layers of opposite conductivity type connected by a metal or a metal silicide layer. The order of these layers in each set of rails is reversed. Thus, in the second rail, a metal or metal silicide layer 19 and a P+ polysilicon layer 18 are deposited onto N+ polysilicon layer 15 in this order. Layers 18, 19, 15, 17 and 16 are patterned together in one or more etching steps to form the second rails 13. In contrast, the P+ polysilicon layer 28 and the metal or metal silicide layer 29 are formed in this order below the N+ polysilicon layer 25 on the gate insulating layer 27. Layers 25, 29, 28, 27 and 26 patterned together in one or more etching steps to form the third rails 23.

In contrast, if the array 100 illustrated in FIG. 8 is being fabricated, then the conductivity type of the lightly doped channel layer in each set of rails is the same. Thus, for example, the channel layer 116, 126 in the second and third rails may comprise an N− amorphous silicon or polysilicon layer. Likewise, each rail contains heavily doped polysilicon layers of the same conductivity type. For example, rails 113 and 123 may contain a single N+ polysilicon layer 125. Alternatively rails 113 and 123 may contain two N+ polysilicon layers separated by a metal or metal silicide layer 129. For example, rail 113 may contain second and fourth N+ polysilicon layers, while rail 123 may contain third and fifth N+ polysilicon layers. Of course, the conductivity types may be reversed in all layers, and p-type semiconductor material may be substituted for n-type semiconductor material. Furthermore, if desired, the silicide layers may be formed by annealing an amorphous silicon/titanium/ titanium nitride film as disclosed in U.S. application Ser. No. 09/927,648 filed on Aug. 13, 2002, incorporated herein by reference in its entirety, rather than by reacting a titanium layer with an adjacent polysilicon layer.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. The drawings are not necessarily to scale and illustrate the device in schematic block format. It is intended that the scope of the invention be defined by the claims appended hereto, and their equivalents.

What is claimed is:

1. A semiconductor device, comprising:
   (a) a first field effect transistor, comprising:
      (i) a first rail comprising a first channel region, a first gate insulating layer, and a first gate electrode,
      (ii) a first source region, and
      (iii) a first drain region,
   (b) a second field effect transistor, comprising:
      (i) a second rail comprising a second channel region, a second gate insulating layer, and a second gate electrode,
      (ii) a second source region, and
      (iii) a second drain region,
   wherein the first rail comprises the second source region or the second drain region.

2. The device of claim 1, wherein the second rail extends in a second direction different from a first direction of the first rail.

3. The device of claim 2, further comprising a third rail extending in the first direction, wherein:
   when the first rail comprises the second source region, the third rail comprises the second drain region; or
   when the first rail comprises the second drain region, the third rail comprises the second source region.

4. The device of claim 3, further comprising:
   a fourth rail extending in the second direction, comprising the first source region, and
   a fifth rail extending in the second direction, comprising the first drain region.

5. The device of claim 4, wherein:
   the first direction is substantially perpendicular to the second direction; and
   the first rail and the third rail are located in a first horizontal plane between the second rail in a second horizontal plane and the fourth and fifth rails located in a third horizontal plane.

6. The device of claim 5, wherein:

the second rail is located above the first and the third rails;

the first and the third rails are located above the fourth and fifth rails;

the fourth and fifth rails are located above a substrate; and the first and the second transistors comprise top gate staggered thin film transistors.

7. The device of claim 6, wherein the third rail comprises a gate electrode of a third field effect transistor.

8. The device of claim 5, wherein:

the first rail comprises a first heavily doped semiconductor layer of a first conductivity type and a first lightly doped semiconductor layer of a second conductivity type containing the first channel region;

the second rail comprises a second heavily doped semiconductor layer of the first conductivity type and a second lightly doped semiconductor layer containing the second channel region;

the third rail comprises a third heavily doped semiconductor layer of the first conductivity type and a third lightly doped semiconductor layer of the second conductivity type;

the fourth rail comprises a fourth heavily doped semiconductor layer of the first conductivity type; and the fifth rail comprises a fifth heavily doped semiconductor layer of the first conductivity type.

9. The device of claim 8, wherein:

one or more of the semiconductor layers in the first through fifth rails is a polysilicon layer; and the first and the second transistors comprise thin film transistors located above an insulating substrate or above an insulating layer formed over a silicon substrate.

10. The device of claim 9, further comprising:

a planarized insulating fill layer located between the first and the third rails and between the fourth and the fifth rails;

a first insulating isolation layer located below the first gate insulating layer in the first rail adjacent to lateral edges of the first channel region to form an island first channel region;

a second insulating isolation layer located below the second gate insulating layer in the second rail adjacent to lateral edges of the second channel region to form an island second channel region; and a metal or a metal silicide layer located in the first through the fifth rails.

11. The device of claim 8, wherein:

the first rail further comprises a first heavily doped semiconductor layer of the second conductivity type electrically connected to the first heavily doped semiconductor layer of the first conductivity type by a metal or a metal suicide layer;

the first heavily doped semiconductor layer of the second conductivity type comprises the second source region or the second drain region of the second transistor; and the first heavily doped semiconductor layer of the first conductivity type comprises the first gate electrode of the first transistor.

12. The device of claim 11, wherein:

the second rail further comprises a second heavily doped semiconductor layer of the second conductivity type electrically connected to the second heavily doped semiconductor layer of the first conductivity type by a metal or a metal silicide layer;

the second heavily doped semiconductor layer of the second conductivity type comprises the second gate electrode of the second transistor;

the second heavily doped semiconductor layer of the first conductivity type comprises a drain or source region of a fourth field effect transistor; and the second lightly doped semiconductor layer containing the second channel region is of the first conductivity type.

13. The device of claim 8, wherein:

the first gate insulating layer comprises at least a portion of a first charge storage region;

the second gate insulating layer comprises at least a portion of a second charge storage region; and the first heavily doped semiconductor layer of the first conductivity type comprises the second source or the second drain region of the second transistor and the first gate electrode of the first transistor.

14. The device of claim 13, wherein:

the second heavily doped semiconductor layer of the first conductivity type comprises the second gate electrode of the second transistor and a drain or source region of a fourth field effect transistor; and the second lightly doped semiconductor layer containing the second channel region is of the second conductivity type.

15. The device of claim 14, wherein the charge storage regions comprises one of dielectric isolated floating gates, ONO dielectric films or insulating layers containing conductive nanocrystals.

16. A monolithic three dimensional array of field effect transistors, comprising:

(a) a substrate;

(b) a plurality of first rails disposed at a first height relative to the substrate in a first direction, wherein each of the plurality of first rails comprises a first heavily doped semiconductor layer of a first conductivity type;

(c) a plurality of second rails disposed in contact with the first rails, at a second height different from the first height, and in a second direction different from the first direction, wherein each of the plurality of second rails comprises a second heavily doped semiconductor layer of the first conductivity type; and (d) a plurality of third rails disposed in contact with the second rails, in the first direction at a third height relative to the substrate such that the second rails are located between the first and the third rails, wherein each of the plurality of third rails comprises a third heavily doped semiconductor layer of the first conductivity type;

wherein portions of the plurality of second rails comprise gate electrodes of a plurality of first field effect transistors and source or drain regions of a plurality of second field effect transistors.

17. The array of claim 16, further comprising a plurality of fourth rails disposed in the second direction at a fourth height relative to the substrate such that the third rails are located between the second and the fourth rails, wherein each of the fourth rails comprises a fourth heavily doped semiconductor layer of the first conductivity type.

18. The array of claim 17, wherein:

portions of the plurality of third rails comprise gate electrodes of the second field effect transistors and source or drain regions of a plurality of third field effect transistors;

portions of the fourth rails comprise gate electrodes of the third field effect transistors.

19. The array of claim 18, wherein:

the first and the second rails comprise a first transistor level, formed in or above the substrate, containing the plurality of first transistors;

the second and the third rails comprise a second transistor level, located above the first level, containing the plurality of second transistors; and the third and the fourth rails comprise a third transistor level, located above the second level, containing the plurality of third transistors.

20. The array of claim 19, further comprising at least one additional transistor level monolithically formed above the third level.

21. The array of claim 16, wherein:

each of the second rails further comprises a second lightly doped semiconductor channel layer of a second conductivity type and a first charge storage region located between the second channel layer and the second heavily doped layer of the first conductivity type;

each of the third rails further comprises a third lightly doped semiconductor channel layer of a second conductivity type and a second charge storage region located between the third channel layer and the third heavily doped layer of the first conductivity type;

each of the second channel layers contacts the first heavily doped layer of the first conductivity type in two of the first rails; and each of the third channel layers contacts the second heavily doped layer of the first conductivity type in two of the second rails.

22. The array of claim 21, further comprising:

planarized insulating fill located between adjacent first rails, between adjacent second rails, and between adjacent third rails; and metal or metal silicide layers located in the first through the third rails, wherein each second rail further comprises a first insulating isolation layer located below the first charge storage region adjacent to lateral edges of the second channel layer to form an island first channel region, and each third rail further comprises a second insulating isolation layer located below the second charge storage region adjacent to lateral edges of the third channel layer to form an island second channel region.

23. The array of claim 16, wherein:

each of the second rails further comprises a first gate insulating layer and a first lightly doped semiconductor layer; and each of the third rails further comprises a second gate insulating layer and a second lightly doped semiconductor layer.

24. The array of claim 23, wherein:

(a) each first field effect transistor comprises:
(i) a first gate electrode comprising a portion of one of the second rails;
(ii) a first channel region comprising a portion of the first lightly doped semiconductor layer located in the same one of the second rails;
(iii) a portion of the first gate insulating layer;
(iv) a first source region comprising a portion of one of the first rails; and
(v) a first drain region comprising a portion of another one of the first rails; and (b) each second field effect transistor comprises:
(i) a second gate electrode comprising a portion of one of the third rails;
(ii) a second channel region comprising a portion of the second lightly doped semiconductor layer located in the same one of the third rails;
(iii) a portion of the second gate insulating layer;
(iv) a second source region comprising a portion of one of the second rails; and
(v) a second drain region comprising a portion of another one of the second rails.

25. The array of claim 24, wherein:

one or more of the semiconductor layers in the first through third rails is a polysilicon layer; and the first transistors and the second transistors comprise top gate staggered thin film transistors located above an insulating substrate or above an insulating layer formed over a silicon substrate.

26. The array of claim 24, wherein:

the first rails are formed in a single crystal silicon substrate;

the first transistors comprise bulk silicon MOSFETs;

one or more of the semiconductor layers in the second and third rails is a polysilicon layer; and the second transistors comprise top gate staggered thin film transistors.

27. The array of claim 26, wherein a direction of the first, the second and the third rails changes over different regions of the substrate.

28. The array of claim 16, wherein:

each of the plurality of second rails further comprises:
a second lightly doped semiconductor channel layer of a second conductivity type in contact with the first rails;
a gate insulating layer between the second channel layer and the second heavily doped layer of the first conductivity type;
a second heavily doped semiconductor layer of the second conductivity type electrically connected to the second heavily doped semiconductor layer of the first conductivity type by a metal or a metal silicide layer;

the second heavily doped semiconductor layer of the first conductivity type comprises a gate electrode of one of the first transistors;

the second heavily doped semiconductor layer of the second conductivity type comprises a source or drain region of one of the second transistors;

each of the plurality of third rails further comprises:
a third lightly doped semiconductor channel layer of the first conductivity type in contact with the second heavily doped layer of the second conductivity type in the second rails;
a third heavily doped semiconductor layer of the second conductivity type electrically connected to the third heavily doped semiconductor layer of the first conductivity type by a metal or a metal silicide layer;
a gate insulating layer between the third channel layer and the third heavily doped layer of the second conductivity type; and the third heavily doped semiconductor layer of the second conductivity type comprises a gate electrode of one of the second transistors.

29. The array of claim 28, wherein gate electrodes of the first transistors of a first polarity are electrically connected to a source or drain of adjacent second transistors of a second polarity without any lateral interconnects.

30. The array of claim 28, further comprising:
a planarized insulating fill located between adjacent first rails, between adjacent second rails, and between adjacent third rails;
a first insulating isolation layer located between the first rails and the second rails;
a second insulating isolation layer located between the second rails and the third rails;
a plurality of first openings in the first isolation layers through which active regions of the second lightly doped semiconductor layers of the second conductivity type in the second rails contact the first heavily doped semiconductor layers of the first conductivity type in the first rails; and
a plurality of second openings in the second isolation layers through which active regions of the third lightly doped semiconductor layers of the first conductivity type in the third rails contact the second heavily doped semiconductor layers of the second conductivity type in the second rails.

31. The array of claim 28, further comprising a plurality of vias extending through the second gate insulating layer and the second channel layer such that the third heavily doped layer of the second conductivity type contacts the second heavily doped layer of the second conductivity type through the vias.

32. The array of claim 31, wherein the vias are arranged such that at least one six transistor SRAM is formed in the array.

33. A monolithic three dimensional memory array of field effect transistors, comprising:
   (a) a substrate;
   (b) a plurality of first rails disposed at a first height relative to the substrate in a first direction, wherein each of the plurality of first rails comprises a first heavily doped semiconductor layer of a first conductivity type;
   (c) a plurality of second rails disposed in contact with the first rails at a second height different from the first height, and in a second direction different from the first direction, wherein each of the plurality of second rails comprises:
      a second heavily doped semiconductor layer of the first conductivity type;
      a second lightly doped semiconductor channel layer of the second conductivity type; and
      a second charge storage region located between the second heavily doped semiconductor layer and the second lightly doped semiconductor layer; and
   (d) a plurality of third rails disposed in the first direction at a third height relative to the substrate such that the second rails are located between the first and the third rails, wherein each of the plurality of third rails comprises:
      a third heavily doped semiconductor layer of the first conductivity type;
      a third lightly doped semiconductor channel layer of the second conductivity type; and
      a third charge storage region located between the third heavily doped semiconductor layer and the third lightly doped semiconductor layer;
   wherein:
      the second lightly doped semiconductor layers in the second rails contact the first heavily doped semiconductor layers in the first rails; and
      the third lightly doped semiconductor layers in the third rails contact the second heavily doped semiconductor layers in the second rails.

34. The array of claim 33, further comprising:
a first insulating isolation layer located between the first rails and the second rails;
a plurality of first openings located in the first insulating isolation layer;
a second insulating isolation layer located between the second rails and the third rails; and
a plurality of second openings located in the second insulating isolation layer.

35. The array of claim 34, wherein:
a plurality of first transistor channel islands comprise portions of the second lightly doped semiconductor layers located in the first openings;
the first transistor channel islands contact the first heavily doped semiconductor layers in the first rails;
first transistor bit lines comprise the first heavily doped semiconductor layers in the first rails;
first transistor word lines comprise the second heavily doped semiconductor layers in the second rails;
a plurality of second transistor channel islands comprise portions of the third lightly doped semiconductor layers located in the second openings;
the second transistor channel islands contact the second heavily doped semiconductor layers in the second rails;
second transistor bit lines comprise the second heavily doped semiconductor layers in the second rails; and
second transistor word lines comprise third heavily doped semiconductor layers in the third rails.

36. The array of claim 35, further comprising:
a plurality of fourth rails disposed in contact with the third rails at a fourth height in the second direction, wherein each of the plurality of fourth rails comprises:
   a fourth heavily doped semiconductor layer of the first conductivity type;
   a fourth lightly doped semiconductor layer of the second conductivity type; and
a fourth charge storage region located between the fourth heavily doped semiconductor layer and the fourth lightly doped semiconductor layer.

37. The array of claim 36, wherein:
the first rails are monolithically located above the substrate;
the second rails are monolithically located on the first rails;
the third rails are monolithically located on the second rails;
the fourth rails are monolithically located on the third rails;
the first and the second rails comprise a first transistor level, formed in or above the substrate, containing a plurality of first transistors; and
the second and the third rails comprise a second transistor level, located above the first level, containing a plurality of second transistors.

38. A method of programming a selected transistor in the array of claim 37, comprising:
applying a high programming voltage to the selected transistor's word line;
grounding the selected transistor's bit lines; and
applying a low programming inhibiting voltage to unselected word lines and bit lines.

39. A method of erasing a selected transistor of the array of claim 37, comprising:
applying a high erase voltage to the selected transistor's bit lines;
grounding the selected transistor's word line; and
applying a low erase inhibiting voltage to other word lines in the same transistor level as the selected transistor's word line and to the other bit lines in the same transistor level as the selected transistor's bit lines.

40. A method of reading a selected transistor of the array of claim 37, comprising:
applying a first low read voltage to the selected transistor's word line;
applying a second read voltage which is lower than the first read voltage to the selected transistor's bit lines;
allowing the word lines in the same transistor level as the selected transistor's word line and the bit lines in the same transistor level as the selected transistor's bit lines to float; and
sensing a current between the selected transistor's bit lines.

41. A method of erasing a block of transistors of the array of claim 37, comprising:
applying a high erase voltage to all bit lines in the block;
grounding word lines in the block; and
applying a low erase voltage to or grounding word lines and bit lines outside of the block to be erased.

42. The array of claim 37, wherein:
a predetermined transistor of the memory array is programmed by applying a high programming voltage to the transistor's word line, grounding the transistor's bit lines and applying a low programming inhibiting voltage to unselected word lines and bit lines;
a predetermined transistor of the memory array is erased by applying a high erase voltage to the transistor's bit lines, grounding the transistor's word line and applying a low erase inhibiting voltage to the word lines in the same transistor level as the predetermined transistor's word line and to the bit lines in the same transistor level as the predetermined transistor's bit lines; and
a predetermined transistor of the memory array is read by applying a first low read voltage to the transistor's word line, applying a second read voltage which is lower than the first read voltage to the transistor's bit lines, allowing the word lines in the same transistor level as the predetermined transistor's word line and the bit lines in the same transistor level as the predetermined transistor's bit lines to float, and sensing a current between the predetermined transistor's bit lines.

43. The array of claim 42, wherein a predetermined block of transistors in a predetermined level of the memory array is erased by applying a high erase voltage to all bit lines in the block, grounding word lines in the block and applying a low erase inhibiting voltage to or grounding word lines and bit lines outside of the predetermined block.

44. A semiconductor device, comprising:
a first transistor having a gate electrode, source, channel, and drain oriented in a first direction;
a second transistor having a gate electrode, source, channel, and drain oriented in a second direction different from said first direction; and
wherein the gate electrode of said first transistor and the source of said second transistor are disposed in a portion of a first rail.

45. The device of claim 44, wherein the first direction is substantially orthogonal to the second direction.

46. The device of claim 45, wherein the channel of the first transistor is located at a first height and the channel of the second transistor is located at a second height different from the first height.

47. The device of claim 46, wherein:
the first rail comprises the channel of the first transistor and extends in the first direction; and
a second rail comprises a source or drain of the first transistor and extends in the second direction.

48. A semiconductor device comprising a first rail, said first rail comprising:
a gate electrode of a first field effect transistor; and
a source or drain of a second field effect transistor;
wherein said first transistor and said second transistor are oriented in non-parallel directions.

49. The device of claim 48, wherein:
the first transistor further comprises:
a first source; and
a first drain; and
the second transistor further comprises:
a second gate electrode; and
a second drain or source.

50. The device of claim 49, wherein:
the second gate electrode comprises a portion of a second rail extending in a second direction different from a first direction of the first rail;
the second drain or source comprises a portion of a third rail extending in the first direction;
the first source comprises a portion of a fourth rail extending in the second direction, and
the first drain comprises a portion of a fifth rail extending in the second direction.

51. The device of claim 50, wherein:
the first direction is substantially perpendicular to the second direction; and
the first rail and the third rail are located in a first horizontal plane between the second rail in a second horizontal plane and the fourth and fifth rails located in a third horizontal plane.

* * * * *